US007608845B2

(12) United States Patent
Abe et al.

(10) Patent No.: US 7,608,845 B2
(45) Date of Patent: Oct. 27, 2009

(54) CHARGED PARTICLE BEAM WRITING APPARATUS AND METHOD THEREOF, AND METHOD FOR RESIZING DIMENSION VARIATION DUE TO LOADING EFFECT

(75) Inventors: Takayuki Abe, Kanagawa (JP); Junichi Suzuki, Saitama (JP); Tomohiro Iijima, Shizuoka (JP); Hideyuki Tsurumaki, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 210 days.

(21) Appl. No.: 11/942,307

(22) Filed: Nov. 19, 2007

(65) Prior Publication Data
US 2008/0182185 A1 Jul. 31, 2008

(30) Foreign Application Priority Data
Nov. 29, 2006 (JP) .............................. 2006-321246

(51) Int. Cl.
H01J 3/14 (2006.01)
G21K 5/10 (2006.01)
G03F 9/00 (2006.01)
G03C 5/00 (2006.01)

(52) U.S. Cl. .............................. 250/492.22; 250/492.1; 250/492.2; 250/306; 250/307; 250/397; 250/396 R; 430/296; 430/942

(58) Field of Classification Search ............ 250/492.22, 250/492.1, 492.2, 306, 307, 397, 396 R; 430/296, 430/942
See application file for complete search history.

(56) References Cited

U.S. PATENT DOCUMENTS 6,346,354 B1 * 2/2002 Abe et al. ...................... 430/30
7,511,290 B2 * 3/2009 Suzuki et al. ........... 250/492.22

(Continued)

FOREIGN PATENT DOCUMENTS

JP 2000-267259 9/2000

(Continued)

OTHER PUBLICATIONS

Nathan Wilcox, et al., "Electron Beam Lithography Time Dependent Dose Correction for Reticle CD Uniformity Enhancement", Proc. Of SPIE, vol. 6283, 2006, pp. 628307-1 to 628307-8.

Primary Examiner—Nikita Wells
(74) Attorney, Agent, or Firm—Oblon, Spivak, McClelland, Maier & Neustadt, L.L.P.

(57) ABSTRACT

A charged particle beam writing apparatus includes a first part configured, based on pattern data, to estimate a total writing time, a second part configured to acquire a base dose at an arbitrary time, after writing start time and within the total writing time by using a first correlation among a time having passed since the writing start time, the total writing time, and the base dose, a third part configured to acquire a fogging effect correction coefficient at the arbitrary time by using a second correlation among the time, the total writing time and the coefficient, a forth part configured to calculate a beam dose at the arbitrary time by using the base dose and the coefficient, a fifth part configured to calculate a beam irradiation time based on the beam dose, a deflector for deflecting the beam, and an aperture for blocking the beam.

9 Claims, 14 Drawing Sheets

U.S. PATENT DOCUMENTS

2007/0114459 A1* 5/2007 Suzuki et al. .......... 250/492.22
2009/0084990 A1* 4/2009 Nishimura et al. ..... 250/492.22

FOREIGN PATENT DOCUMENTS

| JP | 3493094 | 11/2003 |
| KR | 10-2004-0002744 | 1/2004 |
| KR | 10-2006-0045074 | 5/2006 |

* cited by examiner though both the opening 411 and the variable-shaped opening 421 is referred to as a "variable shaping" method.

CHARGED PARTICLE BEAM WRITING APPARATUS AND METHOD THEREOF, AND METHOD FOR RESIZING DIMENSION VARIATION DUE TO LOADING EFFECT

CROSS-REFERENCE TO RELATED APPLICATION

This application is based upon and claims the benefit of priority from the prior Japanese Patent Application No. 2006-321246 filed on Nov. 29, 2006 in Japan, the entire contents of which are incorporated herein by reference.

BACKGROUND OF THE INVENTION

1. Field of the Invention

The present invention relates to a charged particle beam writing method and a resizing method of a dimension variation amount, indicating a critical dimension (CD) difference, due to a loading effect, and more particularly to a method for calculating an electron beam dose to enhance a pattern line width uniformity in electron beam writing. Moreover, this invention is related to a resizing method of previously correcting a dimension variation amount due to a loading effect before inputting data into a pattern writing apparatus.

2. Description of the Related Art

Microlithography technique which forwards miniaturization of semiconductor devices is extremely important, because only this process performs forming a pattern in semiconductor manufacturing processes. In recent years, with an increase in high integration and large capacity of large-scale integrated circuits (LSI), a circuit line width required for semiconductor elements is becoming narrower and narrower. In order to form a desired circuit pattern on these semiconductor devices, a master pattern (also called a mask or a reticle) with high precision is required. Then, since the electron beam technique for writing or "drawing" a pattern has excellent resolution intrinsically, it is used for manufacturing such high precision master patterns.

FIG. 19 shows a schematic diagram describing operations of a conventional variable-shaped electron beam pattern writing apparatus. As shown in the figure, the variable-shaped electron beam pattern writing apparatus (EB (Electron beam) writing apparatus) includes two aperture plates and operates as follows: A first or "upper" aperture plate 410 has an opening or "hole" 411 in the shape of a rectangle, for example, for shaping an electron beam 330. This shape of the rectangular opening may also be a square, a rhombus, a rhomboid, etc. A second or "lower" aperture plate 420 has a variable-shaped opening 421 for shaping the electron beam 330 having passed through the opening 411 of the first aperture plate 410 into a desired rectangular. The electron beam 330 that left a charge particle source 430 and has passed through the opening 411 is deflected by a deflector. Then, the electron beam 330 passes through a part of the variable-shaped opening 421 of the second aperture plate 420, and irradiates a target workpiece or "sample" 340 mounted on a stage that is continuously moving in one predetermined direction (e.g. X-axis direction) during the writing. In other words, a rectangular shape capable of passing through both the opening 411 and the variable-shaped opening 421 is used for pattern writing of the target workpiece 340 mounted on the stage. This method of writing or "forming" a given variable shape by letting beams pass through both the opening 411 and the variable-shaped opening 421 is referred to as a "variable shaping" method.

In recent years, a chemically amplified resist is cited as one of resists often used for an electron beam exposure. The chemically amplified resist has a problem in that the optimal exposed dose changes because of a time elapsed, indicating to be left untouched, before and after the exposure. As a method of solving this problem, there is disclosed a technique that determines a change of resist sensitivity by measuring a film thickness, etc. of a corrected dose pattern and performs irradiation again by using a beam whose diameter is obscured to around 20 μm (refer to, e.g., Japanese Unexamined Patent Publication No. 2000-267259 (JP-A-2000-267259)).

As mentioned above, the chemically amplified resist has the problem that the optimal dose changes because of being left before and after the exposure. In other words, when the chemically amplified resist is used for manufacturing a mask, the line width critical dimension (CD) obtained after writing the mask being a target workpiece changes or "fluctuates" (PED). In the technique described in the Patent Document (JP-A-2000-267259) stated above, there is a problem in that highly precise correction cannot be performed since a dose error occurs with respect to each pattern category. Moreover, there is another problem in that a pattern for determining a corrected dose is needed and a film thickness measuring apparatus, an exposure assist chamber, etc. are also required in addition to an exposure apparatus body. There is a further problem in that the step of performing irradiation again becomes necessary.

It can be supposed that the line width dimension (CD) variation (PED) after writing the mask mentioned above is caused by a diffusion of acid generated by the writing. The acid diffusion occurs in a region of several tens nm, and its occurring rate is around 1.0 nm/h. On the other hand, in the electron beam writing, when electron beams irradiate a target workpiece, such as a mask, on which resist film is applied, there exists a factor, e.g., a fogging effect, causing a dimension variation or "fluctuation" of the resist pattern. The fogging effect is a phenomenon of an irradiated resist caused by a multiple scattering, namely, indicating that a backward scattering electron due to a proximity effect goes out of the resist to be scattered again at the lower part of the electron lens barrel included in a writing apparatus, and irradiates the mask again. The fogging affects a large area (from several mm to several cm). In addition, when etching a shading film etc. being a layer lower than the formed resist pattern as a mask, there exists a phenomenon called the loading effect which causes a dimension variation of the shading film to be etched. The amount of dimension variation due to the fogging effect or loading effect is also affected by the time elapsed after writing the mask.

BRIEF SUMMARY OF THE INVENTION

It is an object of the present invention to provide a method for correcting a line width (CD) variation due to an elapsed time after writing a mask.

In accordance with one aspect of the present invention, a charged particle beam writing apparatus includes a writing time estimation calculating part configured, based on pattern data to be written in a writing region, to estimate a total writing time for writing a pattern based on the pattern data with a charged particle beam, a base dose acquiring part configured to acquire a base dose at an arbitrary time, after writing start time and within the total writing time, in writing using the pattern data, by using a first correlation among a time having passed since the writing start time, the total writing time, and the base dose, a fogging effect correction coefficient acquiring part configured to acquire a fogging effect correction coefficient at the arbitrary time, in writing using the pattern data, by using a second correlation among the time having passed since the writing start time, the estimated total writing time and the fogging effect correction coefficient, a beam dose calculating part configured to calculate a beam dose at the arbitrary time by using the base dose and the fogging effect correction coefficient, a beam irradiation time calculating part configured to calculate a beam irradiation time of the charged particle beam at a position in the writing region, based on a calculated beam dose, a deflector configured to deflect the charged particle beam according to the beam irradiation time, and an aperture configured to block the charged particle beam deflected by the deflector.

In accordance with another aspect of the present invention, a charged particle beam writing apparatus includes a writing time estimation calculating part configured, based on pattern data to be written in a writing region, to estimate a total writing time for writing the pattern data with a charged particle beam, a loading effect correction coefficient acquiring part configured to acquire a loading effect correction coefficient at an arbitrary time, after writing start time and within the total writing time, in writing using the pattern data, by using a correlation among a time having passed since the writing start time, the total writing time, and the loading effect correction coefficient, a dimension variation amount calculating part configured to calculate a dimension variation amount due to a loading effect at the arbitrary time by using the loading effect correction coefficient, a beam dose acquiring part configured to acquire a beam dose at the arbitrary time based on the dimension variation amount, a beam irradiation time calculating part configured to calculate a beam irradiation time of the charged particle beam at a position in the writing region, based on a acquired beam dose, a deflector configured to deflect the charged particle beam according to the beam irradiation time, and an aperture configured to block the charged particle beam deflected by the deflector.

In accordance with another aspect of the present invention, a charged particle beam writing method includes inputting pattern data to be written in a writing region, estimating a total writing time for writing a pattern based on the pattern data, acquiring a base dose at an arbitrary time, after writing start time and within the total writing time, in writing using the pattern data, by using a first correlation among a time having passed since the writing start time, the total writing time, and the base dose, acquiring a fogging effect correction coefficient at the arbitrary time, in writing using the pattern data, by using a second correlation among the time having passed since the writing start time, the total writing time and the fogging effect correction coefficient, calculating a beam dose at the arbitrary time by using the base dose and the fogging effect correction coefficient, and writing a position in the writing region with the charged particle beam, according to the beam dose.

In accordance with another aspect of the present invention, a charged particle beam writing method includes estimating a total writing time for writing a pattern to be written in a writing region based on a pattern data, acquiring a loading effect correction coefficient at an arbitrary time, after writing start time and within the total writing time, in writing using the pattern data, by using a correlation among a time having passed since the writing start time, the total writing time, and the loading effect correction coefficient, calculating a dimension variation amount due to the loading effect at the arbitrary time by using the loading effect correction coefficient, obtaining a beam dose at the arbitrary time based on the dimension variation amount, and writing a position in the writing region with the charged particle beam, according to the beam dose.

In accordance with another aspect of the present invention, a method for resizing a dimension variation amount includes estimating a total writing time for writing a pattern to be written in a writing region based on a pattern data, acquiring a loading effect correction coefficient at an arbitrary time, after writing start time and within the total writing time, in writing using the pattern data, by using a correlation among a time having passed since the writing start time, the total writing time, and the loading effect correction coefficient, calculating a dimension variation amount due to the loading effect at the arbitrary time by using the loading effect correction coefficient, and resizing the pattern data according to an estimated time to be passed since the writing start time, based on the dimension variation amount and outputting resized pattern data.

In accordance with another aspect of the present invention, a computer-readable storage medium having stored therein a program for causing a computer includes storing, in a storage device, first correlation information among a time having passed since writing start time, an estimated total writing time and a base dose, and second correlation information among the time having passed since the writing start time, the estimated total writing time and a fogging effect correction coefficient, inputting pattern data to be written in a writing region, calculating a total writing time for writing a pattern based on the pattern data, reading the first correlation information from the storage device, and acquiring a base dose at an arbitrary time, after the writing start time and within the total writing time, in writing using the pattern data, reading the second correlation information from the storage device, and acquiring a fogging effect correction coefficient at the arbitrary time in writing using the pattern data, and calculating a beam dose at the arbitrary time by using the base dose acquired and the fogging effect correction coefficient acquired, and outputting a calculated beam dose.

In accordance with another aspect of the present invention, a computer-readable storage medium having stored therein a program for causing a computer includes storing, in a storage device, correlation information among a time having passed since writing start time, an estimated total writing time and a loading effect correction coefficient, inputting pattern data to be written in a writing region, calculating a total writing time for writing a pattern based on the pattern data, reading the correlation information from the storage device, and acquiring a loading effect correction coefficient at an arbitrary time, after the writing start time and within the total writing time, in writing using the pattern data, calculating a dimension variation amount due to the loading effect at the arbitrary time by using the loading effect correction coefficient acquired, and obtaining a beam dose at the arbitrary time based on the dimension variation amount, and outputting an obtained beam dose.

DETAILED DESCRIPTION OF THE INVENTION

In the following Embodiments, a structure using an electron beam as an example of a charged particle beam will be described. The charged particle beam is not restricted to the electron beam, but may be a beam using other charged particle, such as an ion beam.

Embodiment 1

Figure 1:
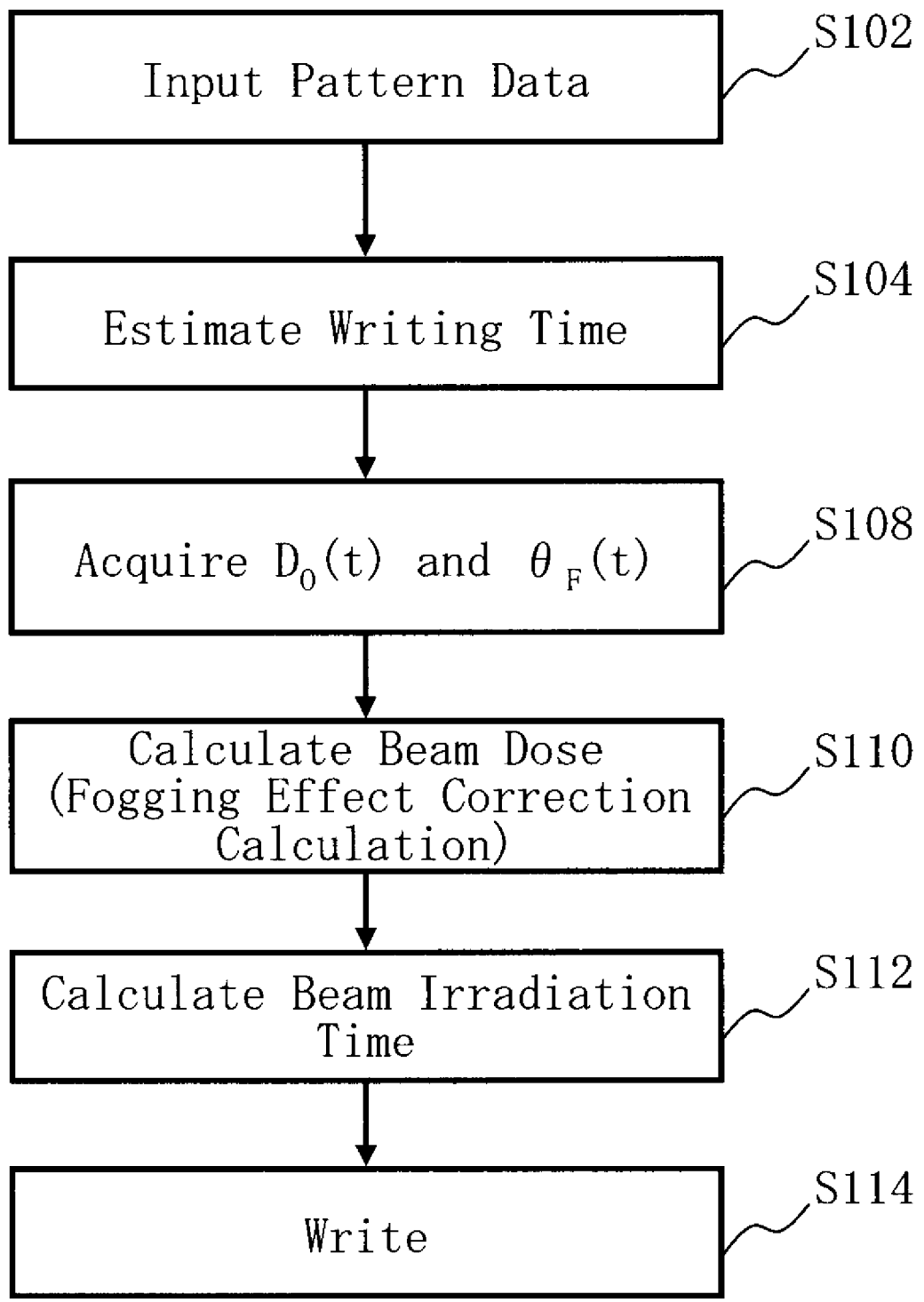
FIG. 1 is a flowchart showing main steps of an electron beam writing method described in Embodiment 1.

A structure in which a dimension variation amount due to the fogging effect is corrected by using an exposure dose will be described in Embodiment 1. FIG. 1 is a flowchart showing main steps of an electron beam writing method described in Embodiment 1. In the figure, the electron beam writing method executes a series of steps including a pattern data input step (S102), a writing time estimation step (S104), an acquisition step (S108) of a base or "reference" dose $D_0(t)$ and a fogging effect correction coefficient $\theta_F(t)$, a beam dose calculation step (S110), a beam irradiation time calculation step (S112), and a writing step (S114).

Figure 2:
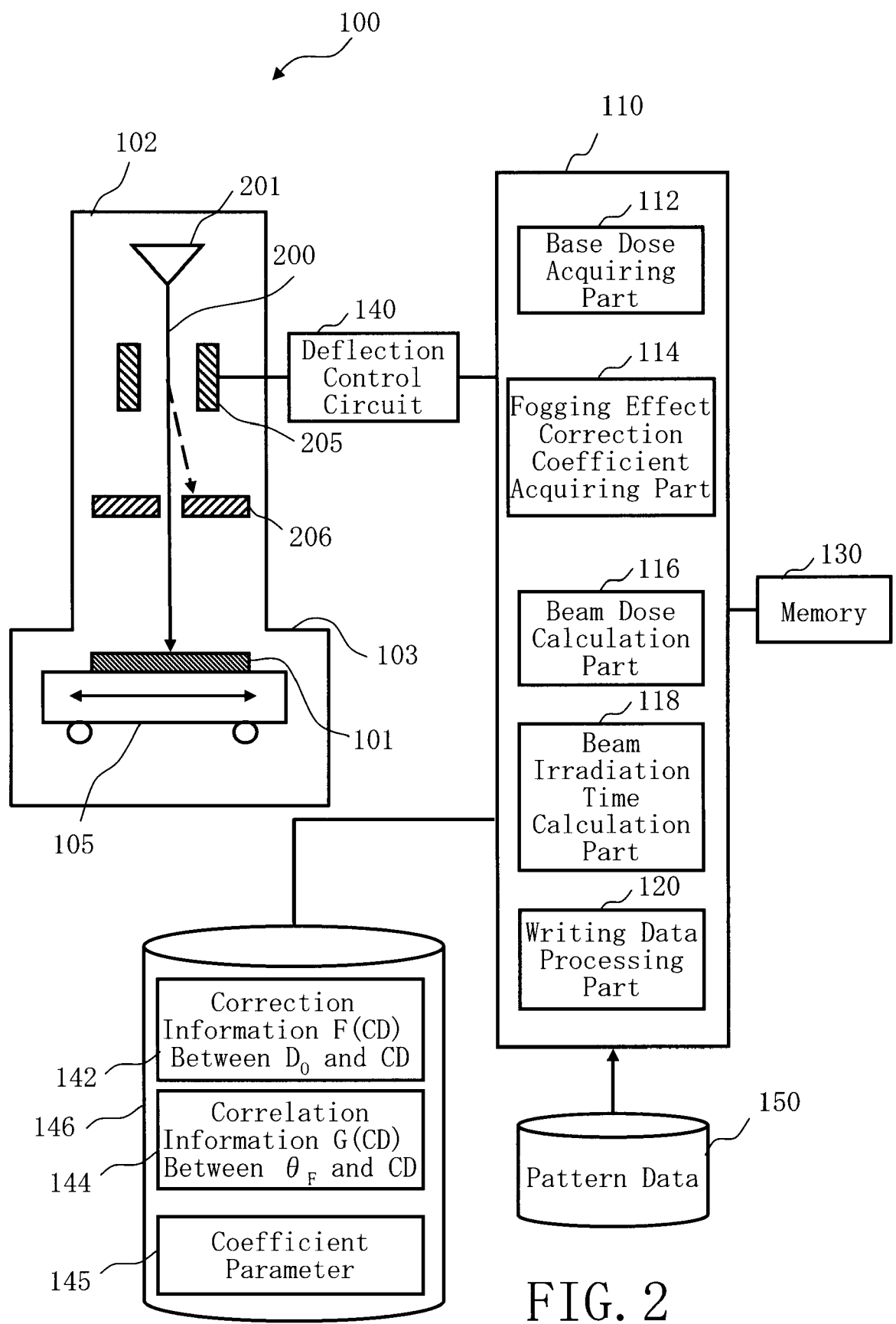
FIG. 2 is a schematic diagram showing an example of a main part of an EB pattern writing apparatus described in Embodiment 1.

FIG. 2 is a schematic diagram showing an example of a main part of a pattern writing apparatus according to Embodiment 1. In the figure, a pattern writing apparatus 100 serving as an example of a charged particle beam pattern writing apparatus. The pattern writing apparatus 100 writes a predetermined pattern onto a target workpiece 101 by using a lithography technique. The pattern writing apparatus 100 includes a writing part and a control part. The writing part includes an electron lens barrel 102 and a writing chamber 103. The electron lens barrel 102 includes an electron gun assembly 201, a blanking deflector 205, and a blanking aperture plate 206. In the writing chamber 103, there is arranged an XY stage 105 on which the target workpiece 101, such as a mask used as a writing object, is placed. The control part includes a control computing unit 110, a memory 130 used as an example of a storage device, a magnetic disk unit 146 used as an example of a storage device, and a deflection control circuit 140. The control computing unit 110 has functions of a base dose acquiring part 112, a fogging effect correction coefficient acquiring part 114, a beam dose calculating part 116, a beam irradiation time calculating part 118, and a writing data processing part 120. Pattern data 150 is input into the control computing unit 110. Moreover, correlation information 142 between a base dose $D_0$ and a CD, correlation information 144 between a fogging effect correction coefficient $\theta_F$ and the CD, and a coefficient parameter 145 are stored in the magnetic disk unit 146. While only the structure elements necessary for explaining Embodiment 1 are shown in FIG. 2, it should be understood that other structure elements generally necessary for the pattern writing apparatus 100 are also included. Moreover, although it is shown in FIG. 2 that the control computing unit 110 serving as an example of a computer executes each of the functions of the base dose acquiring part 112, the fogging effect correction coefficient acquiring part 114, the beam dose calculating part 116, the beam irradiation time calculating part 118, and the writing data processing part 120, it should not be limited thereto. For example, they may be executed by hardware of an electric circuit. Alternatively, they may be executed by a combination of hardware and software, or a combination of hardware and firmware.

An electron beam 200 emitted from the electron gun assembly 201 is irradiated onto a desired position of the target workpiece 101 on the XY stage 105. The electron beam 200 is controlled by a predetermined current density J. Moreover, the electron beam 200 serves as an example of a charged particle beam. The XY stage 105 is movably arranged, and continues to move during writing. In order to prevent the electron beam 200 from being excessively irradiated on the workpiece 101, when the electron beam 200 on the target workpiece 101 attains an irradiation time required for a desired dose to be incident on the target workpiece 101, the electron beam 200 is controlled not to reach the target workpiece 101. As a method, for example, the electron beam 200 is deflected by the electrostatic type blanking deflector 205, and is also cut by the blanking aperture plate 206, which prevents the electron beam 200 from reaching on the target workpiece 101. The deflecting voltage of the blanking deflector 205 is controlled by the deflection control circuit 140 and an amplifier (not shown).

In the case of Beam ON (blanking OFF), that is a beam irradiation time while the blanking function is OFF, the electron beam 200 emitted from the electron gun assembly 201 goes along the track indicated by the solid line in FIG. 2. On the other hand, in the case of Beam OFF (blanking ON), that is a time of refusing the beam irradiation while the blanking function is ON, the electron beam 200 emitted from the electron gun assembly 201 goes along the track indicated by the dotted line in FIG. 2. Moreover, the insides of the electron lens barrel 102 and the writing chamber 103 in which the XY stage 105 is arranged are exhausted by a vacuum pump (not shown), and controlled to be a pressure lower than atmospheric pressure.

While FIG. 2 shows the structure elements necessary for explaining Embodiment 1, the pattern writing apparatus 100 may also be provided with the following structure in addition to the structure mentioned above. In other words, an illumination lens, a first aperture plate, a projection lens, a forming deflector, a second aperture plate, an objective lens, an object deflector, and the like may also be provided in the electron lens barrel 102. In the case of Beam ON (blanking OFF) in the structure mentioned above, the electron beam 200 emitted from the electron gun assembly 201 irradiates the whole of the first aperture plate 203 having a rectangular opening, for example, by the illumination lens. This shape of the rectangular opening may also be a square, a rhombus, a rhomboid, etc. At this point, the electron beam 200 is shaped to be a rectangle. Then, after having passed through the first aperture plate, the electron beam 200 of a first aperture image is guided by the projection lens to reach the second aperture plate. The position of the first aperture image on the second aperture plate is controlled by the forming deflector, and thereby the shape and size of the beam can be changed. After having passed through the second aperture plate, the electron beam 200 of a second aperture image is focus-adjusted by the objective lens and deflected by the object deflector, to reach a desired position on the target workpiece 101 placed on the XY stage 105 which is movably arranged. The variable-shaped EB writing apparatus can be structured by the structure elements stated above.

A dose D (x, y) of the electron beam 200 in which the fogging effect is corrected can be obtained by the following equation (1).

$$D(x,y) = D_O \cdot D_F(x,y) \qquad (1)$$

As shown in the equation (1), a dose D (x, y) that is obtained by multiplying a base dose $D_0$ by a fogging effect correction dose $D_F$ (x, y) can correct the dimension variation due to the fogging effect. The fogging effect correction dose $D_F$ (x, y) is a standardized correction amount. An approximate solution of the fogging effect correction dose $D_F$ (x, y) can obtain by the following equations (2) using a fogging effect correction coefficient $\theta_F$, for example.

$$D_F(x, y) = \frac{1}{1 + \theta_F U_F(x, y)} \qquad (2)$$

Compared with the influence range (several tens of μm) of the proximity effect, the influence range (several mm to several cm) of the fogging effect is very large. A writing region of a mask pattern is divided into mesh-like areas having a length on the order of am to μm as a global ranging, for example 0.5 to 1.0 mm long. Then, this mesh-like area is defined as a unit area (mesh area) for performing the fogging effect correction. With respect to each unit area for performing the fogging effect correction, a fogging effect correction dose $D_F$(x, y) for performing the fogging effect correction is calculated. The fogging effect correction coefficient $\theta_F$ serves as an indication showing an amount of the fogging effect, and it may be a value of 0.04 to 0.1 depending upon the resist applied on the target workpiece 101. Moreover, a distribution function $U_F$(x, y) of the fogging effect can be approximated by the Gaussian distribution of a fogging effect influence range (dispersion radius) $\sigma_F$, as shown in the equation (3) below.

$$U_F(x, y) = \frac{1}{\pi \sigma_F^2} \int \exp\left(-\frac{x^2}{\sigma_F^2} - \frac{y^2}{\sigma_F^2}\right) dx\, dy \qquad (3)$$

Integration herein is performed for a pattern to be irradiated. Alternatively, defining the pattern density at a position x=(x, y) to be ρ(x, y), it can be approximated by the following equation (4).

$$U_F(x, y) = \frac{1}{\pi \sigma_F^2} \int \rho(x, y) \exp\left(-\frac{x^2}{\sigma_F^2} - \frac{y^2}{\sigma_F^2}\right) dx\, dy \qquad (4)$$

Figure 3:
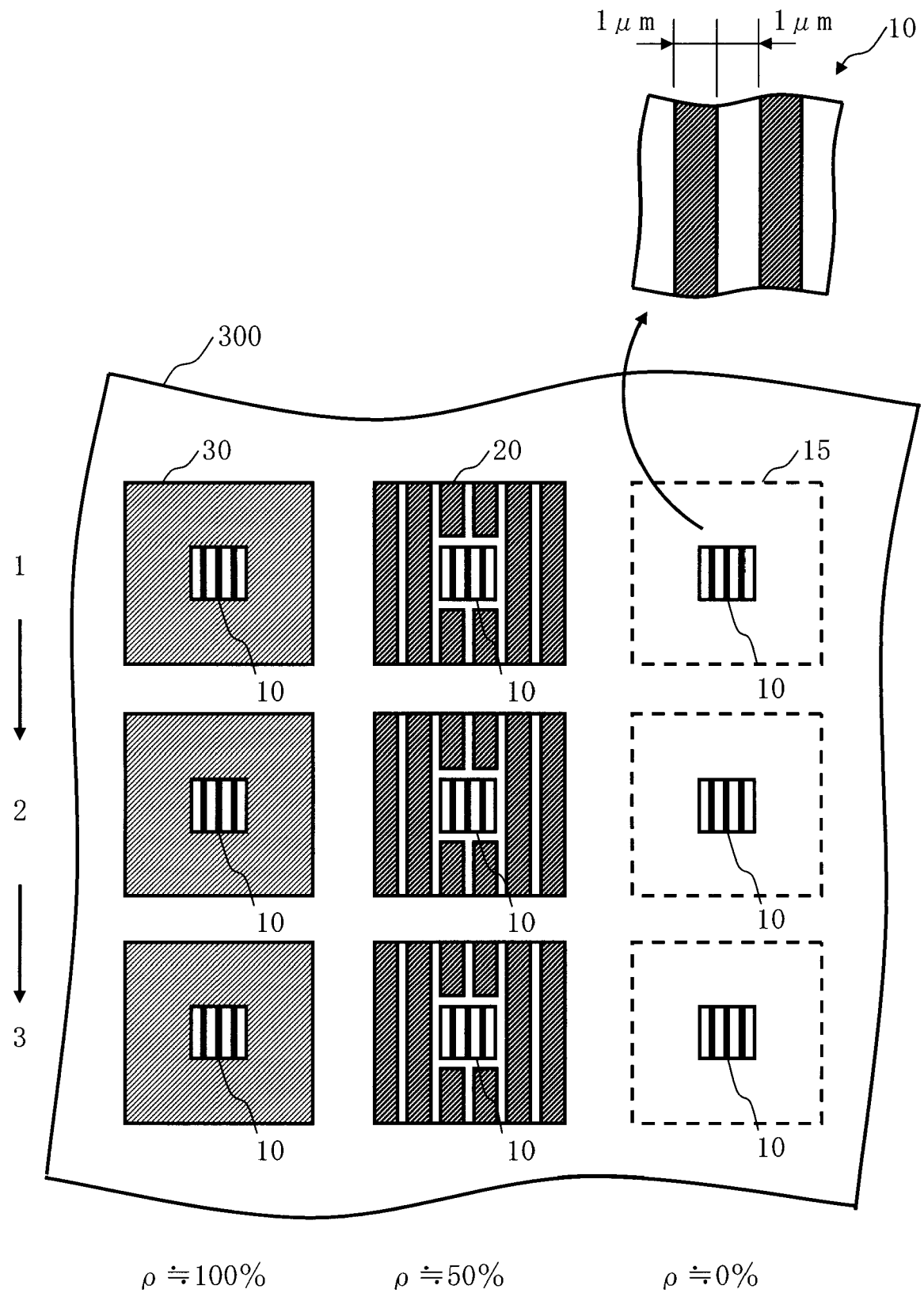
FIG. 3 shows an example of a substrate for a prior experiment described in Embodiment 1.

In this case, even if the fogging effect correction is merely performed, a dimension variation may occur because of an elapsed time after writing. FIG. 3 shows an example of a substrate for a prior experiment described in Embodiment 1. In the figure, a line & space pattern 10 of 1 μm is written or "drawn" onto a substrate 300 by using the EB pattern writing apparatus 100. In that case, a chip group of chips of three types, a chip 15 in which the pattern area density of the circumference of the pattern 10 is set to be 0%, a chip 20 in which it is set to be 50%, and a chip 30 in which it is set to be 100% are written. Each of the chips has the same size, and is set to be 4 cm square, for example. Two or more rows of the chip group are written. As the writing method, the EB pattern writing apparatus 100 writes each chip group with shifting the writing start time. In FIG. 3, it is written in order of 1→2→3 from the upper chip group to a lower one. For example, each of the chips of the same area density is written every hour. For example, one hour after the chip 30 of the first row having been written, the chip 30 of the second row is written. Then, one hour after the chip 30 of the second row having been written, the chip 30 of the third row is written. Similarly, one hour after the chip 20 of the first row having been written, the chip 20 of the second row of is written. Then, one hour after the chip 20 of the second row having been written, the chip 20 of the third row is written. Similarly, one hour after the chip 15 of the first row having been written, the chip 15 of the second row is written. Then, one hour after the chip 15 of the second row having been written, the chip 15 of the third row is written. In writing these, as the substrate 300, a chromium (Cr) film serving as a shading layer is formed on a clear glass substrate, such as quartz, and a chemically amplified resist film is formed on the Cr film. Then, in order to have many measuring points, a plurality of substrates 300 of the above type are prepared. It is preferable to write a chip of the first row of the posterior substrate 300 one hour after the chip of the last row of the prior substrate 300 was written.

Figure 4:
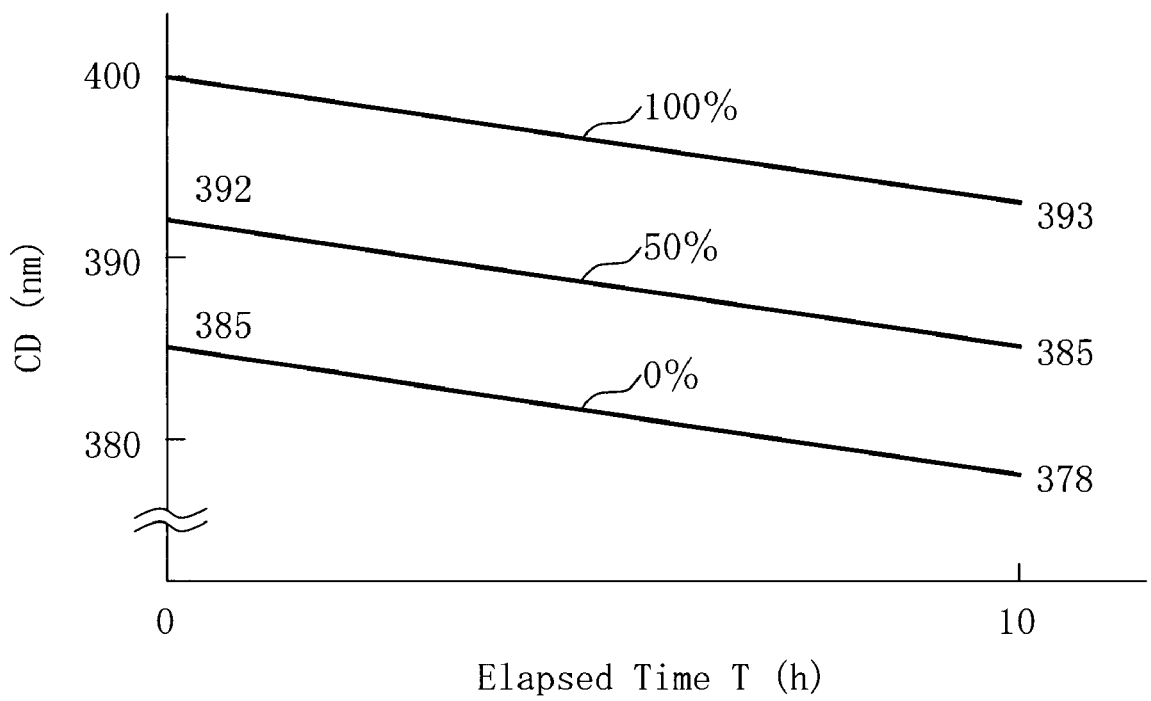
FIG. 4 is a graph showing an example of a correlation between an elapsed time after writing a pattern and a pattern line width (CD) according to Embodiment 1.

FIG. 4 is a graph showing an example of a correlation between an elapsed time after writing and a pattern line width (CD) according to Embodiment 1. As shown in FIG. 4, it can be known that the CD varies or "fluctuates" in a predetermined gradient in the cases of the pattern area densities of 0%, 50% and 100% depending upon the elapsed time T after electron beam writing. In this case, as an example, the pattern line width (CD) is in primary proportion to the elapsed time T of the chip. It is preferable to select the optimal relation based on the resist characteristics. In the following explanation, the time spent for writing each chip is assumed to be short enough to be disregarded. Therefore, an elapsed time after writing a certain chip is described as a time initiated from the writing start time of the chip concerned. As an example herein, the CD of the chip of each pattern area density becomes smaller by 7 mn when 10 hours have passed. As to the CD dimension, the line width of the pattern 10 is measured. Since the fogging effect correction etc. has not been performed in this case, the CD fluctuates depending upon the pattern area density.

Figure 5:
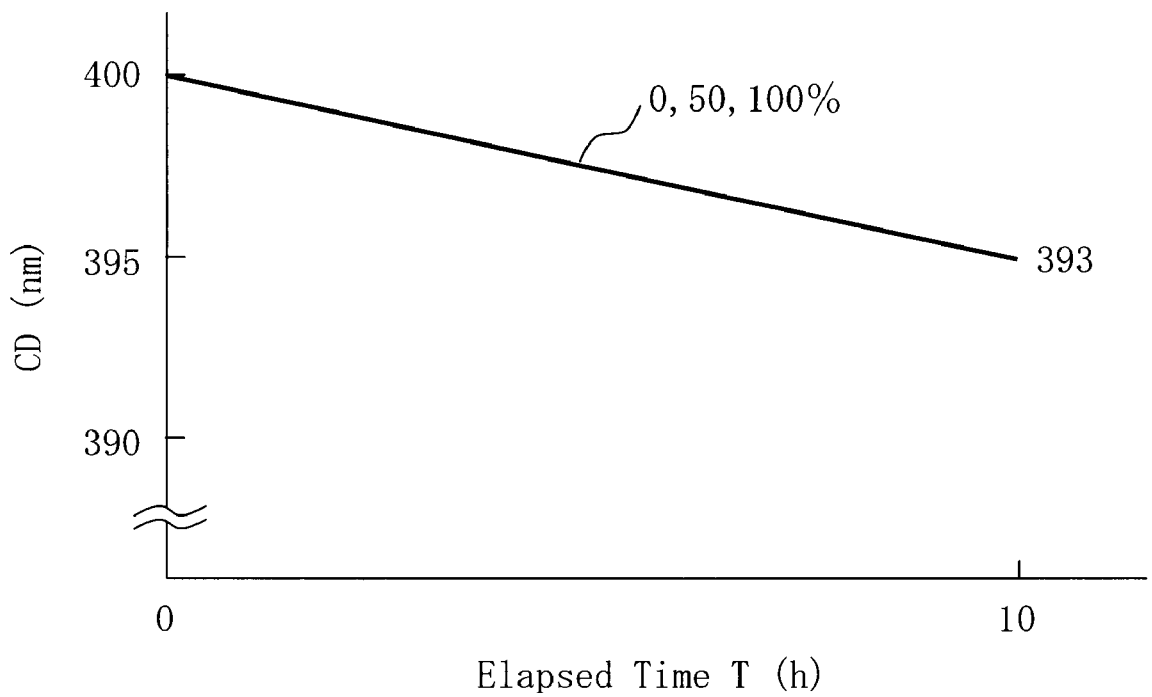
FIG. 5 is a graph showing an example of a correlation between an elapsed time after writing a pattern and a pattern line width (CD) in the case of performing a fogging effect correction according to Embodiment 1.

FIG. 5 is a graph showing an example of a correlation between an elapsed time after writing and a pattern line width (CD) in the case of performing the fogging effect correction according to Embodiment 1. The CD variation caused by a difference in pattern area density can be corrected by correcting the dose of the electron beam 200 according to the equations (1) to (3). However, as shown in FIG. 5, it can be known that the CD varies in a specific gradient depending upon the elapsed time T after writing. In this case also, as an example, the pattern line width (CD) can be approximated by using a primary proportion. Also herein, the CD becomes smaller by 7 mn when 10 hours have passed as the elapsed time, for example.

Figure 6:
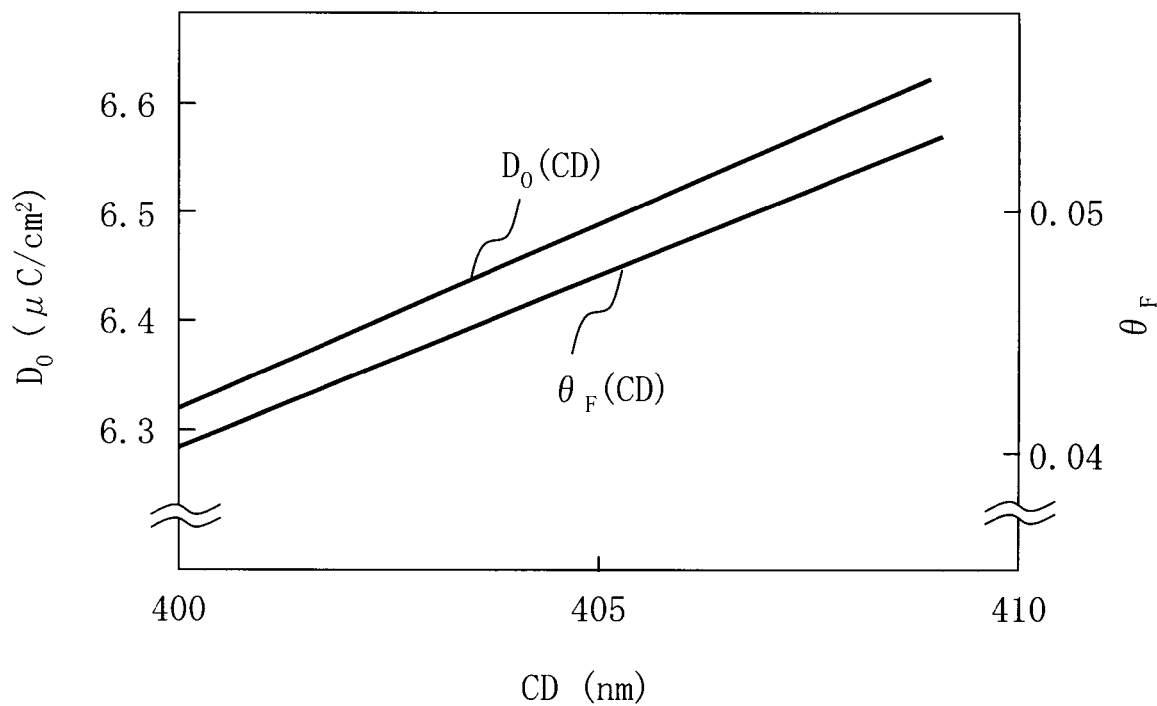
FIG. 6 is a graph showing an example of a correlation between a pattern line width (CD) and a base dose $D_0$, and a correlation between a pattern line width (CD) and a fogging effect correction coefficient $\theta_F$ according to Embodiment 1.

Next, by performing different experiments, the correlation between a pattern line width (CD) and a base dose $D_0$, and the correlation between a pattern line width (CD) and a fogging effect correction coefficient $\theta_F$ are obtained. FIG. 6 is a graph showing an example of the correlation between a pattern line width (CD) and a base dose $D_0$, and the correlation between a pattern line width (CD) and a fogging effect correction coefficient $\theta_F$. As shown in FIG. 6, the base dose $D_0$ can be defined by a function $D_0$ (CD) in which the pattern line width (CD) is set to be a variable. It is shown in the graph that the base dose $D_0$ is in proportion to the pattern line width (CD), as an example. This correlation information F (CD) 142 is stored in the magnetic disk unit 146. Similarly, the fogging effect correction coefficient $\theta_F$ can be defined by the function $\theta_F$ (CD) in which the pattern line width (CD) is set to be a variable. As an example, it is shown in the graph that the fogging effect correction coefficient $\theta_F$ is in proportion to the pattern critical dimension (CD). Then, this correlation information G(CD) 144 is stored in the magnetic disk unit 146.

Figure 7:
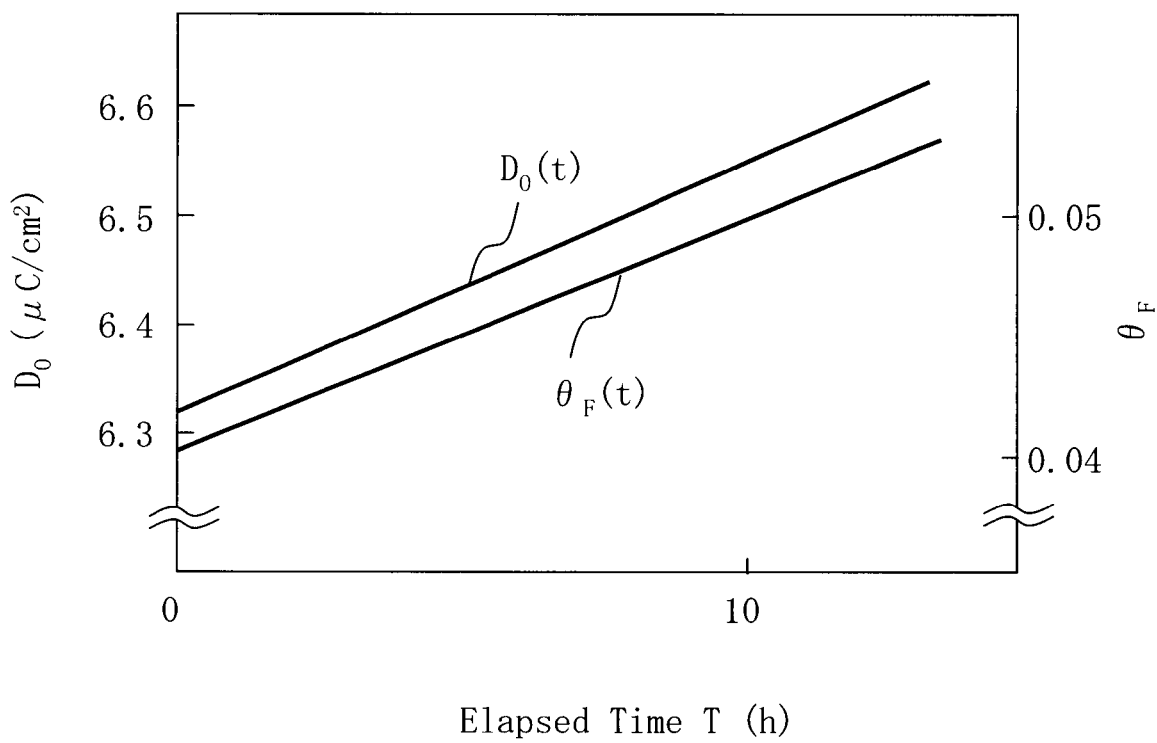
FIG. 7 is a graph showing an example of a correlation between a base dose $D_0$ to be used for correcting and an elapsed time T after writing, and a correlation between a fogging effect correction coefficient $\theta_F$ to be used for correcting and the elapsed time T after writing according to Embodiment 1.

FIG. 7 is a graph showing an example of a correlation between a base dose $D_0$ to be used for correcting and an elapsed time T after writing, and a correlation between a fogging effect correction coefficient $\theta_F$ to be used for correcting and an elapsed time T after writing.

Time having passed since the writing start time is defined as "t". Time (total writing time) from the writing start time to the time when all the chip groups have been written is defined to be $t_w$. Then, the elapsed time T is a difference value ($T=t_w-t$) obtained by subtracting the time t from the total writing time $t_w$. What is necessary for correcting the phenomenon that the CD decreases with the time elapsed after writing is to make the dimension of the CD large when writing a pattern, at the rate responding to the decrease of the CD. In the case of FIG. 5, for example, as the CD decreases by 7 nm after 10 hours have elapsed, what is necessary for writing a chip which is to be left for 10 hours after being written, namely whose elapsed time is to be 10 hours, is to correct a dose at the time of writing so that the CD produced by the dose may become larger by 7 nm than a finally desired size. Then, in the case of defining $D_0(t)=D_0\{CD(t)\}$ and $\theta_F(t)=\theta_F\{CD(t)\}$, the correlation as shown in the graph of FIG. 7 can be obtained. A time variation $D_0$ (t) of the base dose $D_0$ for correcting a dimension variation due to the elapsed time can be approximated by the following equation (5).

$$D_O(t)=D_O(t=w)+\alpha(t_w-t) \tag{5}$$

$D_0$ (t=w) indicates a value in the case of there being no elapsed time. A proportional coefficient $\alpha$ can be obtained by the equation (5). This proportional coefficient $\alpha$ becomes one of coefficient parameters 145 of $D_0(t)$, and is stored in the magnetic disk unit 146. A time variation $\theta_F(t)$ of the fogging effect correction coefficient $\theta_F$ for correcting the dimension variation due to the elapsed time can be approximated by the following equation (6). $\theta_F$ (t=w) indicates a value in the case of there being no elapsed time.

$$\theta_F(t)=\theta_F(t=w)+\beta(t_w-t) \tag{6}$$

A proportional coefficient $\beta$ can be obtained by the equation (6). This proportional coefficient $\beta$ becomes one of coefficient parameters 145 of $\theta_F(t)$, and is stored in the magnetic disk unit 146.

As mentioned above, the correlation $D_0$ (t) among the time t having passed since the writing start time, the total writing time $t_w$, and the base dose $D_0$ can be obtained based on a first coefficient parameter (coefficient $\alpha$) and a relation between the pattern line width CD and the base dose $D_0$. The first coefficient parameter (coefficient $\alpha$) can be obtained based on the relation between an elapsed time T after writing and a base dose $D_0$ for correcting a pattern line width CD which varies depending upon the elapsed time. The correlation $\theta_F$ (t) among the time t having passed since the writing start time, the total writing time $t_w$, and the fogging effect correction efficient $\theta_F$ can be obtained based on a second coefficient parameter (coefficient $\beta$) and a relation between the pattern line width CD and the fogging effect correction efficient $\theta_F$. The second coefficient parameter (coefficient $\beta$) can be obtained based on the relation between an elapsed time T after writing and the fogging effect correction efficient $\theta_F$ for correcting a pattern line width CD which varies depending upon the elapsed time.

The electron beam writing method according to the present Embodiment will now be described referring to the explanation mentioned above as an assumption.

At Step (S) 102, as a pattern data input step, the control computing unit 110 inputs the pattern data 150 to write a pattern in a writing region. The inputted pattern data 150 is stored in the memory 130 or the magnetic disk unit 146.

At Step 104, as a writing time estimation step, the writing data processing part 120 being an example of a writing time estimation calculating part generates shot data based on the pattern data 150, and calculates a total writing time $t_w$ for writing the pattern data 150 based on the shot data. In other words, the total writing time $t_w$ required for writing a pattern is estimated. If the total writing time is already known, it is acceptable to input the known time.

At Step 108, as a base dose acquisition step, the base dose $D_0$ at an arbitrary time, after the writing start time and within the writing time, for writing the pattern data 150 is acquired by using a correlation among the time t having passed since the writing start time, the estimated total writing time $t_w$, and the base dose $D_0$. Similarly, as a fogging effect correction coefficient acquisition step, the fogging effect correction coefficient $\theta_F$ at an arbitrary time, after the writing start time and within the writing time, for writing the pattern data 150 is acquired by using a correlation among the time t having passed since the writing start time, the estimated total writing time $t_w$, and the fogging effect correction coefficient $\theta_F$. First, the base dose acquiring part 112 reads the correlation information 142 from the magnetic disk unit 146. Then, a base dose $D_0$ (t=w) corresponding to a desired CD in the case of there being no elapsed time is calculated. Next, the coefficient parameter 145 is read from the magnetic disk unit 146. By using the $D_0$ (t=w) and the coefficient $\alpha$, the base dose $D_0$ at an arbitrary time after the writing start time is calculated based on the equation (5). As to the order of reading the correlation information 142 and the coefficient parameter 145, whichever of the two may come first. Alternatively, both of them can be read at the same time.

Then, the fogging effect correction coefficient acquiring part 114 also reads the correlation information 144 from the magnetic disk unit 146. Then, a fogging effect correction coefficient $\theta_F$ (t=w) corresponding to a desired CD in the case of there being no elapsed time is calculated. Next, the coefficient parameter 145 is read from the magnetic disk unit 146. By using the fogging effect correction coefficient $\theta_F$ (t=w) and the coefficient $\beta$, the fogging effect correction coefficient $\theta_F$ (t) at an arbitrary time after the writing start time is calculated based on the equation (6). As to the order of reading the correlation information 144 and the coefficient parameter 145, whichever of the two may come first. Alternatively, both of them can be read at the same time.

At Step 110, as a beam dose calculation step, the beam dose calculating part 116 calculates a dose D (x, y) at an arbitrary time after the writing start by using the base dose $D_0$ (t) and the fogging effect correction coefficient $\theta_F$ (t) at an arbitrary time after the writing start time. The equations (1) to (3) mentioned above can be used for the calculating. In that case, the base dose $D_0$ (t) can be used as the base dose $D_0$ which is substituted in the equation at an arbitrary time after writing start. The fogging effect correction coefficient $\theta_F$ (t) can be used as the fogging effect correction coefficient $\theta_F$ which is substituted in the equation at the arbitrary time.

At Step 112, as a beam irradiation time calculation step, the beam irradiation time calculating part 118 calculates a beam irradiation time Td of the electron beam 200 at a position in the writing region at an arbitrary time after the writing start time. The dose D (x, y) can be defined by a product of the beam irradiation time Td and a current density J. Therefore, the beam irradiation time Td can be obtained by dividing the dose D (x, y) by the current density J.

At Step 114, as a writing step, the control computing unit 110 outputs a signal to the deflection control circuit 140 so that the beam irradiation onto a target workpiece may become OFF at the calculated beam irradiation time Td. Then, in the deflection control circuit 140, the blanking deflector 205 is controlled so that the electron beam 200 may be deflected in accordance with the calculated beam irradiation time Td based on the signal outputted from the control computing unit 110. After the desired dose D (x, y) is irradiated onto the target workpiece 101, the electron beam 200 deflected by the blanking deflector 205 is blocked by the blanking aperture plate 206 in order not to reach the target workpiece 101.

Figure 8:
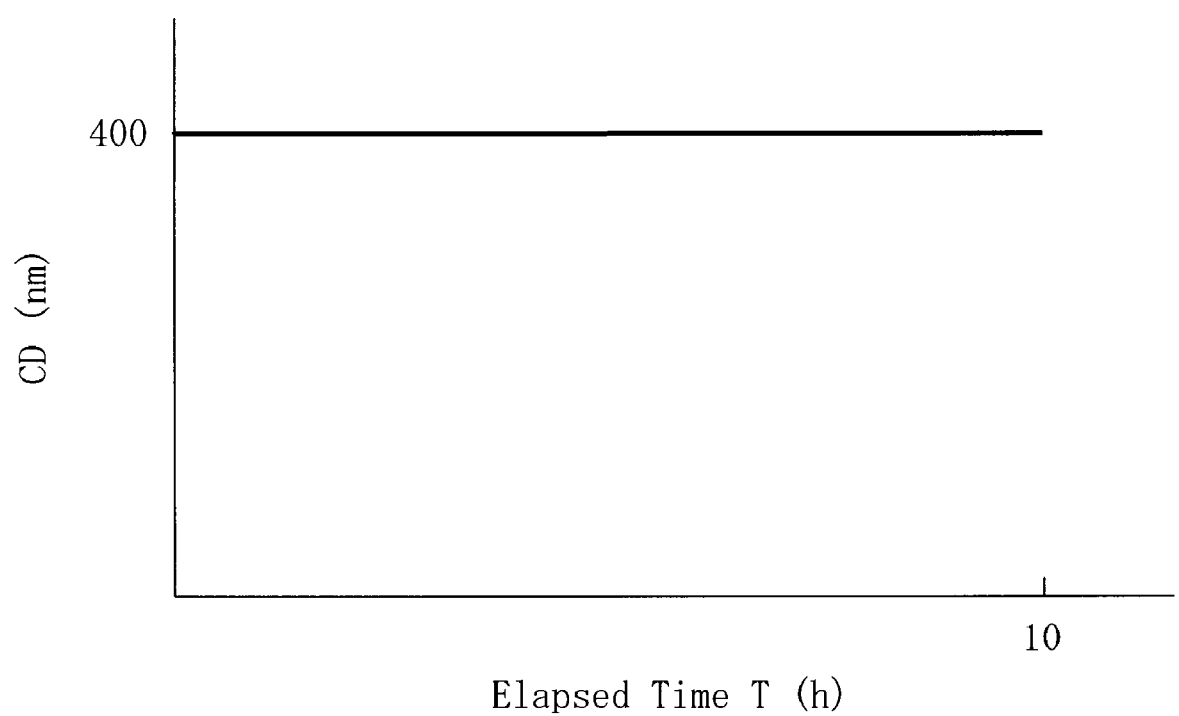
FIG. 8 is a graph showing an example of a correlation between a pattern line width (CD) after correcting and an elapsed time T described in Embodiment 1.

FIG. 8 is a graph showing an example of a correlation between a pattern line width (CD) after correcting and an elapsed time T described in Embodiment 1. By changing the base dose $D_0$ (t) and the fogging effect correction coefficient $\theta_F$(t) according to the time, as shown in FIG. 8, the uniformity of the line width dimension can be enhanced. Thus, it becomes possible to perform correcting the dimension variation due to the fogging effect, by taking the elapsed time into consideration.

As mentioned above, the error between pattern categories can be reduced by changing the base dose $D_0$ (t) and the fogging effect correction coefficient $\theta_F$(t) depending upon a time. Moreover, it is possible to prevent throughput degradation due to a film thickness measurement, re-irradiation, and the like. Furthermore, according to the present Embodiment, even if there is no pattern for determining a corrected dose, such as the pattern described in JP-A-2000-267259, it is possible to calculate the dose for correcting the line width (CD) variation of a mask at an arbitrary time after writing. Furthermore, even if there is no film thickness measuring apparatus, exposure assist chamber and the like in addition to the main part of the exposure apparatus, the dose for correcting the line width (CD) variation at an arbitrary time after writing the mask can be calculated.

In the example mentioned above, the base dose $D_0$ (t) and the fogging effect correction coefficient $\theta_F$(t) are calculated by using the equations (5) and (6). However, it is not limited thereto. For example, it is also suitable to perform calculation by the method described below. First, instead of the coefficient parameter 145, the correlation information CD(T) between the elapsed time T and the CD as shown in FIG. 5 is stored in the magnetic disk unit 146. Then, the base dose acquiring part 112 reads the correlation information CD(T) from the magnetic disk unit 146. With respect to a desired CD at an arbitrary time after the writing start time, the elapsed time T is calculated based on T=$t_w$−t. Then, CD', whose dimension has changed because of the elapsed time T, is calculated based on the correlation information CD(T). Next, the correlation information 142 is read from the magnetic disk unit 146. The base dose $D_0$ corresponding to the CD' at the elapsed time T having passed is calculated. This calculated base dose $D_0$ becomes the base dose $D_0$(t) at an arbitrary time after the writing start time. As to the order of reading the correlation information 142 and the correlation information CD(T), whichever of the two may come first. Alternatively, both of them can be read at the same time.

Next, the fogging effect correction coefficient acquiring part 114 also reads the correlation information CD(T) from the magnetic disk unit 146. With respect to a desired CD at an arbitrary time after the writing start time, the elapsed time T is calculated based on T=$t_w$−t. Then, CD', whose dimension has changed because of the elapsed time T, is calculated based on the correlation information CD(T). Then, the correlation information 144 is read from the magnetic disk unit 146. The fogging effect correction coefficient $\theta_F$ corresponding to the CD' at the elapsed time T having passed is calculated. This calculated fogging effect correction coefficient $\theta_F$ becomes the fogging effect correction coefficient $\theta_F$(t) at an arbitrary time after the writing start time. As to the order of reading the correlation information 144 and the correlation information CD(T), whichever of the two may come first. Alternatively, both of them can be read at the same time. Furthermore, as to the values of the elapsed time T and the CD' obtained by the base dose acquiring part 112 or the fogging effect correction coefficient acquiring part 114, it is further suitably efficient to use the values even by the other of the acquiring parts 112 and 114. It is preferable to configure the correlation information CD(T), the correlation information F(CD) 142, and the correlation information G(CD) 144 by an approximate expression, a table, or the like.

As mentioned above, according to Embodiment 1, it is possible to calculate the dose for correcting the line width (CD) variation due to the fogging effect after writing the mask at an arbitrary time after the writing start time. Then, by performing writing using such a calculated dose, the line width (CD) variation due to the fogging effect because of a time elapsed after the writing can be corrected.

Embodiment 2

Figure 9:
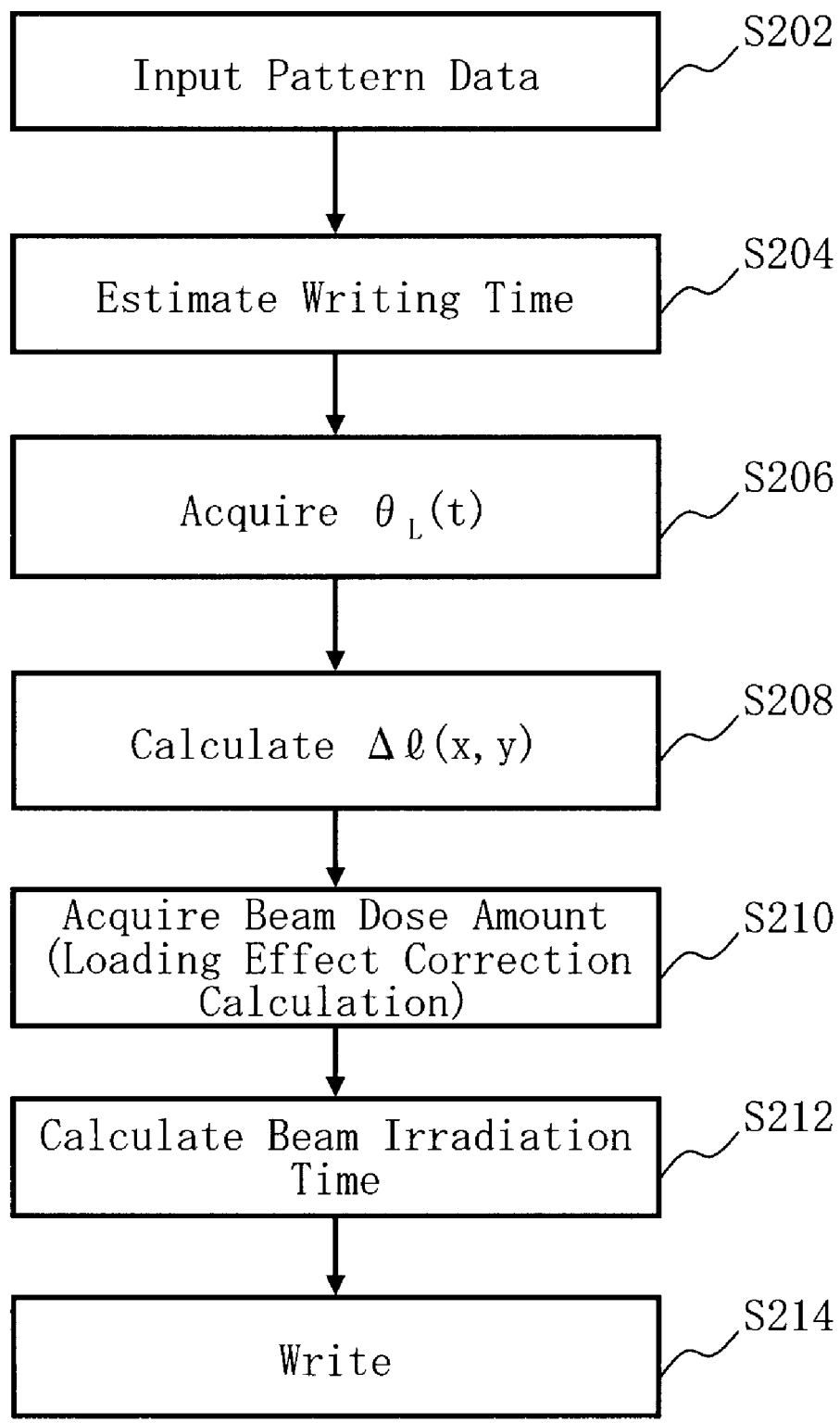
FIG. 9 is a flowchart showing main steps of an electron beam writing method described in Embodiment 2.

A structure in which a dimension variation amount due to the loading effect is corrected by using an exposure dose will be described in Embodiment 2. FIG. 9 is a flowchart showing main steps of an electron beam writing method described in Embodiment 2. In the figure, the electron beam writing method executes a series of steps including a pattern data input step (S202), a writing time estimation step (S204), an acquisition step (S206) of a loading effect correction coefficient $\theta_L(t)$, a calculation step (S208) of a dimension variation amount $\Delta l(x, y)$ caused by a loading effect, a beam dose acquisition step (S210), a beam irradiation time calculation step (S212), and a writing step (S214).

Figure 10:
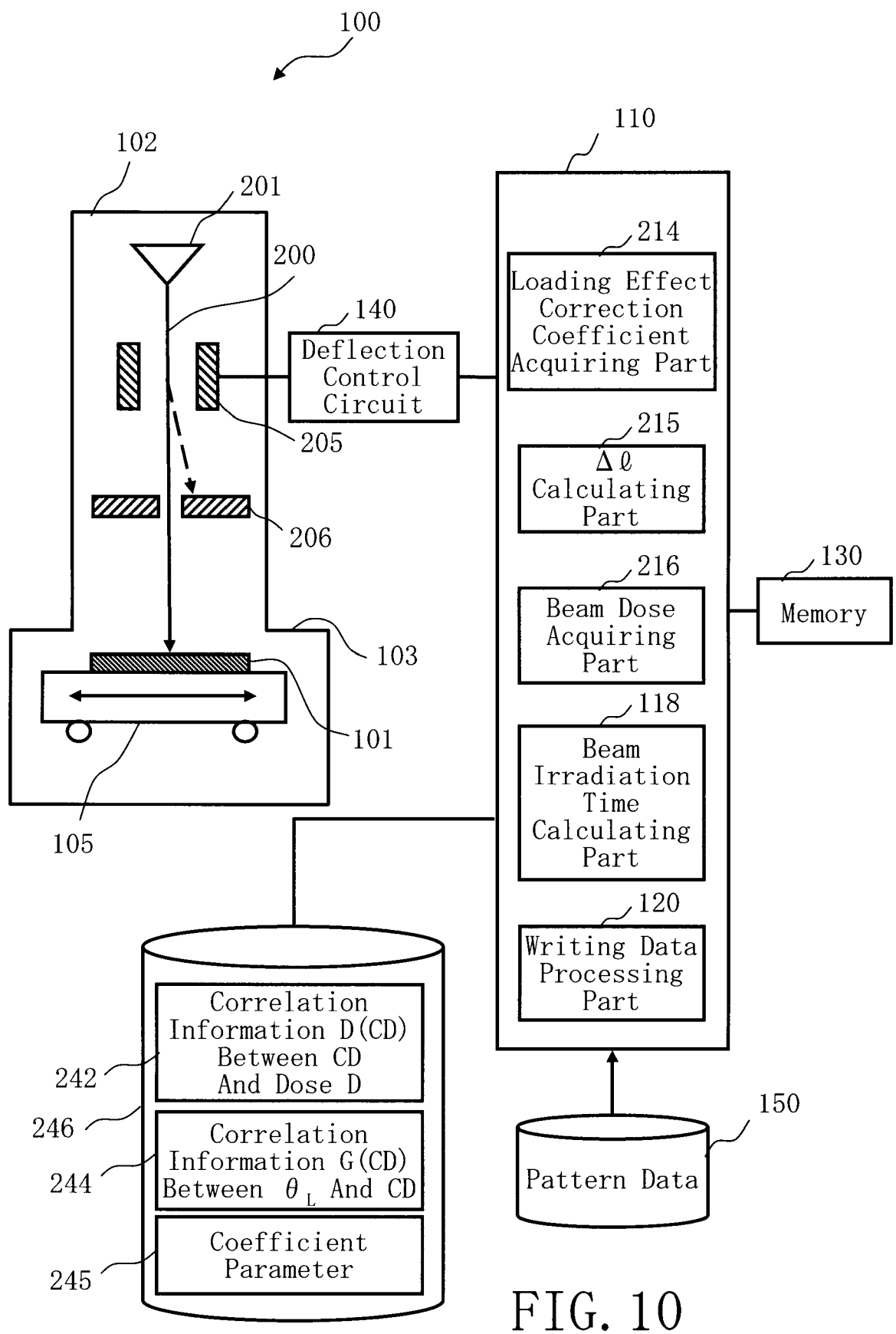
FIG. 10 is a schematic diagram showing an example of a main part of an EB pattern writing apparatus according to Embodiment 2.

FIG. 10 is a schematic diagram showing an example of a main part of an EB pattern writing apparatus according to Embodiment 2. In the figure, the EB pattern writing apparatus 100 includes a magnetic disk unit 246 instead of the magnetic disk unit 146. Although the functions included in the control computing unit 110 are different from those in Embodiment 1, the other structure elements are the same as those described in Embodiment 1. In FIG. 10, the control computing unit 110 has functions of a loading effect correction coefficient acquiring part 214, a dimension variation amount $\Delta l(x, y)$ calculating part 215, the beam dose acquiring part 216, a beam irradiation time calculating part 118, and a writing data processing part 120. Moreover, correlation information 242 between the CD and the dose D, correlation information 244 between a loading effect correction coefficient $\theta_L$ and the CD, and a coefficient parameter 245 are stored in the magnetic disk unit 246. While only the structure elements necessary for explaining Embodiment 2 are shown in FIG. 10, it should be understood that other structure elements generally necessary for the EB pattern writing apparatus 100 are also included. Moreover, although it is shown in FIG. 10 that the control computing unit 110 serving as an example of a computer executes each of the functions of the loading effect correction coefficient acquiring part 214, the dimension variation amount $\Delta l(x, y)$ calculating part 215, the beam dose acquiring part 216, the beam irradiation time calculating part 118, and the writing data processing part 120, it should not be limited thereto. For example, they may be executed by hardware of an electric circuit. Alternatively, they may be executed by a combination of hardware and software, or a combination of hardware and firmware.

While only the structure elements necessary for explaining Embodiment 2 are shown in FIG. 10, the EB pattern writing apparatus 100 may also include the structure elements stated below in addition to the structure stated above, as well as Embodiment 1. In other words, the electron lens barrel 102 may include an illumination lens, a first aperture plate, a projection lens, a forming deflector, a second aperture plate, an objective lens, an object deflector, and the like.

As shown in the following equation (7), the pattern line width dimension variation amount $\Delta l(x, y)$ due to a loading effect can be approximated by the Gaussian distribution, using a loading effect correction coefficient $\theta_L$, a loading effect influence range (radius of scattering or dispersions) $\sigma_L$, etc.

$$\Delta\lambda(x, y) = \frac{\theta_L}{\pi\sigma_L^2}\int \exp\left(-\frac{x^2}{\sigma_L^2} - \frac{y^2}{\sigma_L^2}\right)dxdy + f(x, y) \quad (7)$$

Integration is herein performed for a pattern to be irradiated. Alternatively, defining a pattern density at a position $x=(x, y)$ to be $\rho(x, y)$, it can be approximated by the following equation (8).

$$\Delta\lambda(x, y) = \frac{\theta_L}{\pi\sigma_L^2}\int \rho(x, y)\exp\left(-\frac{x^2}{\sigma_L^2} - \frac{y^2}{\sigma_L^2}\right)dxdy + f(x, y) \quad (8)$$

The first term in the equation (7) is a dimension variation amount due to the loading effect depending on a pattern area density. $f(x, y)$ in the second term is a dimension variation amount due to the loading effect depending on a position. Therefore, it becomes possible to correct the dimension to be a desired one by conversely making these dimension variation amounts $\Delta l(x, y)$ increase and decrease at the time of writing.

Compared with the influence range (several tens of μm) of the proximity effect, the influence range (several mm to several cm) of the loading effect is very large. A writing region of a mask pattern is divided into mesh-like areas having a length on the order of μm to mm as a global ranging, for example 0.5 to 1.0 mm long. Then, this mesh-like area is defined as a unit area (mesh area) for performing the loading effect correction. With respect to each loading effect correction unit area, a dimension variation amount $\Delta l(x, y)$ for performing the loading effect correction is calculated. Moreover, the loading effect correction coefficient $\theta_L$ serves as an indication showing a maximum value amount of dimension variation due to the loading effect depending upon a pattern area density.

Similarly to the case of the fogging effect correction, even if the loading effect correction is merely performed, a dimension variation due to the elapsed time after writing occurs. As to the substrate used in a prior experiment in Embodiment 2, the same substrate as that in FIG. 3 is used. Then, the writing is performed similarly to that of FIG. 3. As a result, the correlation between the elapsed time after writing and the pattern line width (CD) as shown in FIG. 4, which is similar to the one described in Embodiment 1, can be obtained. Since the loading effect correction is not performed in this case, the CD varies depending upon the difference in pattern area density.

Figure 11:
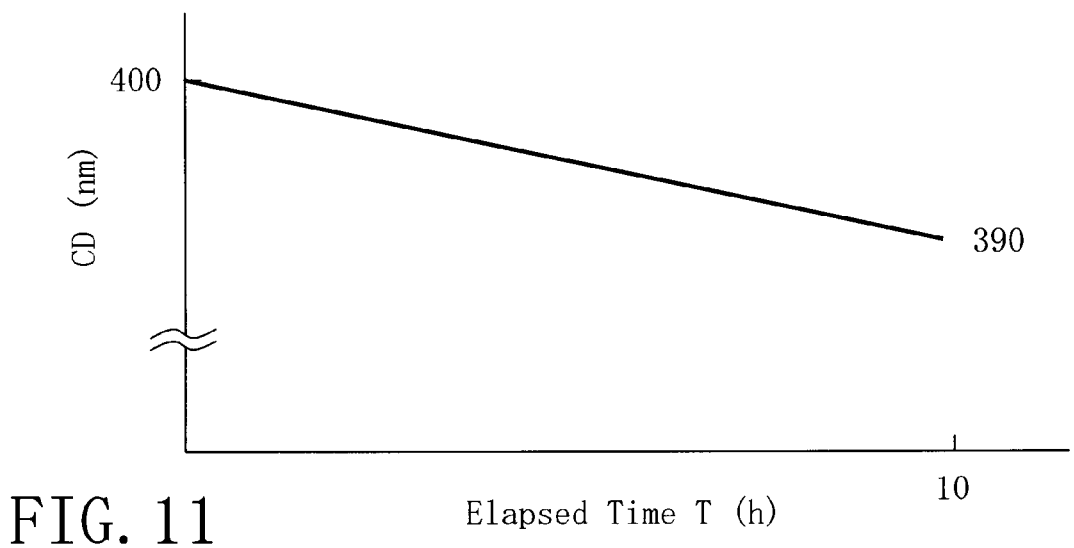
FIG. 11 is a graph showing an example of a correlation between an elapsed time after writing and a pattern line width (CD) in the case of performing a loading effect correction according to Embodiment 2.

FIG. 11 is a graph showing an example of a correlation between an elapsed time after writing and a pattern line width (CD) in the case of performing the loading effect correction according to Embodiment 2. A dimension variation amount $\Delta l(x, y)$ is calculated based on the equation (7). The CD variation caused by a difference in pattern area density can be corrected by resizing the dimension variation amount $\Delta l(x, y)$ or by using the beam dose at the time of writing for correcting the dimension variation amount $\Delta l(x, y)$. However, as shown in FIG. 11, it can be known that the CD varies in a specific gradient depending upon the elapsed time T after writing. In this case also, as an example, the pattern line width (CD) can be approximated by using a primary proportion.

Figure 12:
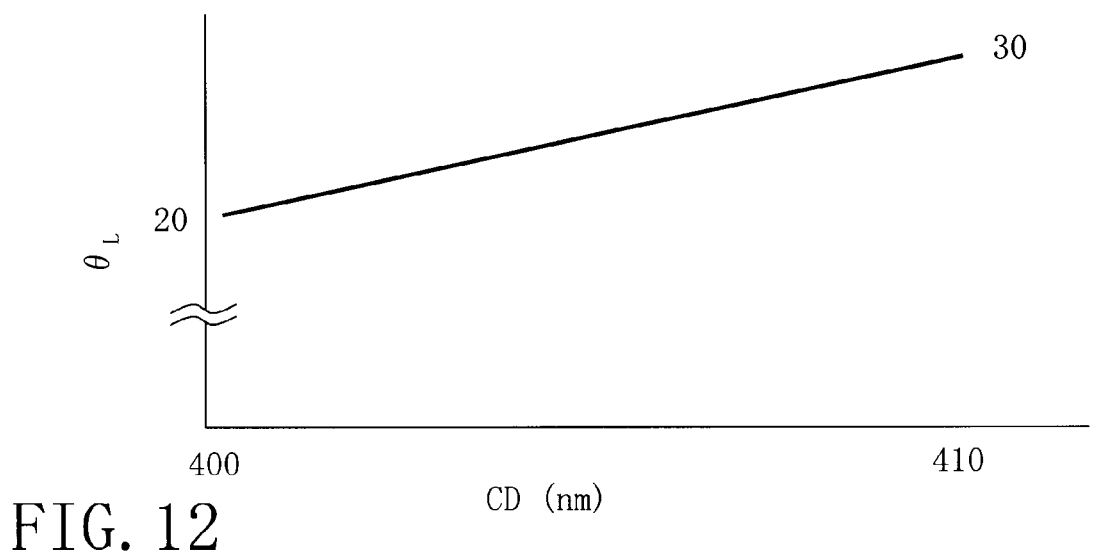
FIG. 12 is a graph showing an example of a correlation between a pattern line width (CD) and a loading effect correction coefficient $\theta_L$ according to Embodiment 2.

Next, by performing different experiments, the correlation between a pattern line width (CD) and a loading effect correction coefficient $\theta_L$ is obtained. FIG. 12 is a graph showing an example of the correlation between a pattern line width (CD) and a loading effect correction coefficient $\theta_L$. As shown in FIG. 12, the loading effect correction coefficient $\theta_L$ can be defined by a function $\theta_L$ (CD) in which the pattern line width (CD) is set to be a variable. It is shown in the graph that the loading effect correction coefficient $\theta_L$ is in proportion to the pattern line width (CD), as an example. This correlation information G (CD) 244 is stored in the magnetic disk unit 246.

Figure 13:
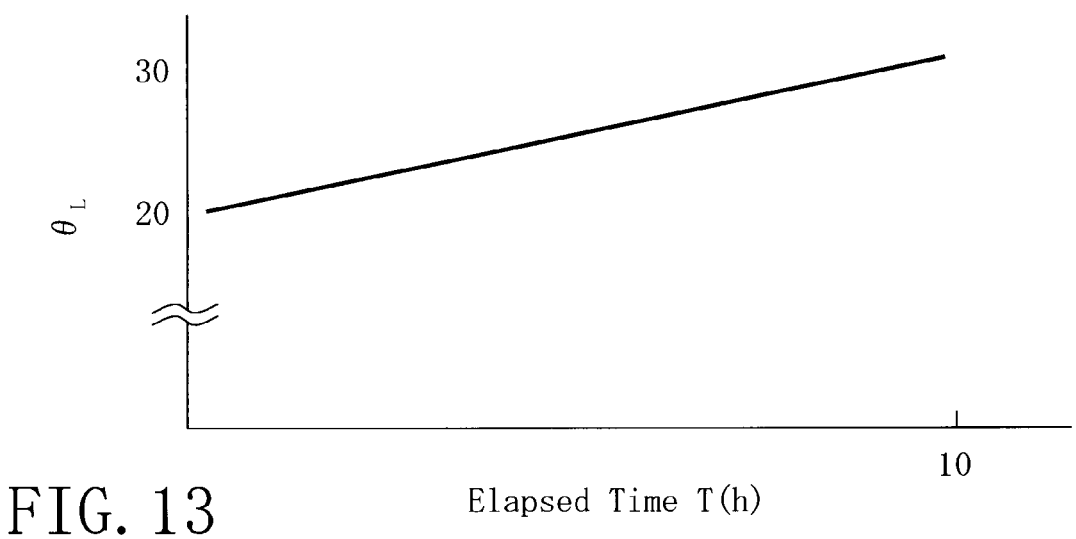
FIG. 13 is a graph showing an example of a correlation between a loading effect correction coefficient $\theta_L$ to be used for correcting and an elapsed time T after writing according to Embodiment 2.

FIG. 13 is a graph showing an example of a correlation between a loading effect correction coefficient $\theta_L$ to be used for correcting and an elapsed time T after writing.

Time having passed since the writing start time is defined as "t". In this case, similarly to the case of Embodiment 1, the elapsed time T is a difference value ($T=t_w-t$) obtained by subtracting the time t from the total writing time $t_w$. What is necessary for correcting the phenomenon that the CD decreases with the time elapsed after writing is to make the dimension of the CD large when writing a pattern, at the rate responding to the decrease of the CD. Then, in the case of defining $\theta_L(t)=\theta_L\{CD(t)\}$, the correlation as shown in the graph of FIG. 13 can be obtained. A time variation $\theta_L(t)$ of the loading effect correction coefficient $\theta_L$ for correcting a dimension variation due to the elapsed time can be approximated by the following equation (9). $\theta_L(t=w)$ indicates a value in the case of there being no elapsed time.

$$\theta_L(t)=\theta_L(t=w)+\gamma(t_w-t) \quad (9)$$

A proportional coefficient $\gamma$ can be obtained by the equation (9). This proportional coefficient $\gamma$ becomes a coefficient parameter 245 of $\theta_L(t)$, and is stored in the magnetic disk unit 246.

As mentioned above, the correlation $\theta_L(t)$ among the time t having passed since the writing start time, the total writing time $t_w$, and the loading effect correction coefficient $\theta_L$ can be obtained based on a coefficient parameter (coefficient $\gamma$) and a relation between the pattern line width CD and the loading effect correction coefficient $\theta_L$. The coefficient parameter (coefficient $\gamma$) can be obtained based on the relation between an elapsed time T after writing and a loading effect correction coefficient $\theta_L$ for correcting a pattern line width CD which varies depending upon the elapsed time.

Figure 14:
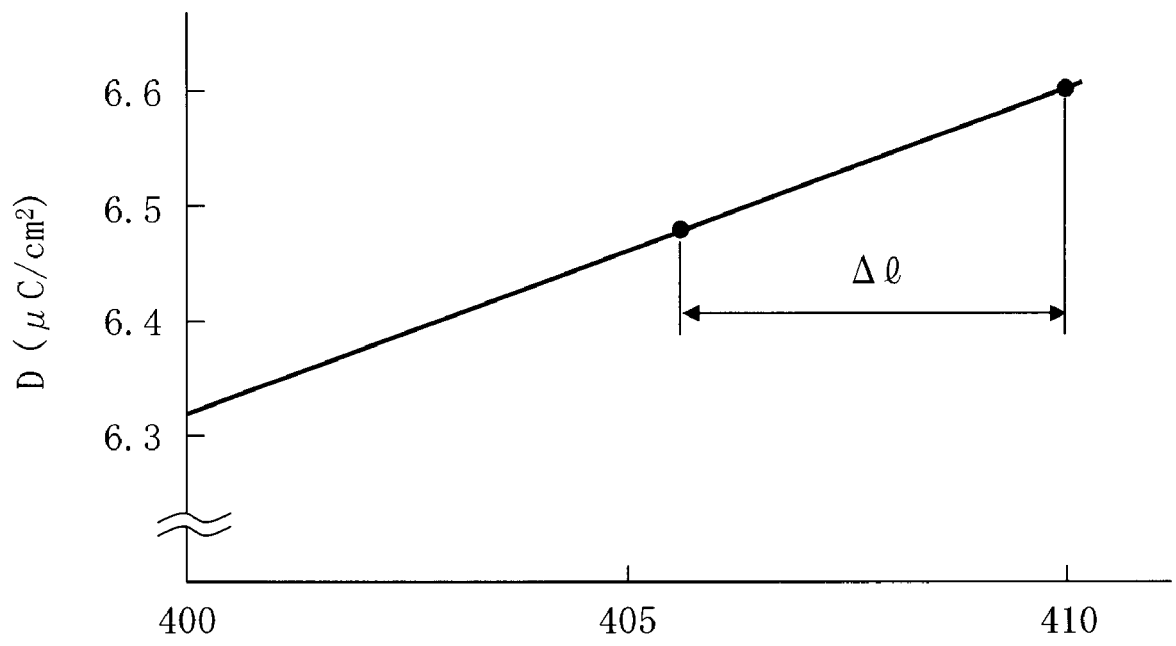
FIG. 14 is a graph showing an example of a correlation between a CD and a beam dose D according to Embodiment 2.

FIG. 14 is a graph showing an example of a correlation between the CD and the dose D according to Embodiment 2.

If a dimension variation amount $\Delta l(x, y)$ which should be corrected can be obtained, a value of CD to be written after correcting can be obtained by adding the dimension variation amount $\Delta l(x, y)$ to a desired CD. As shown in FIG. 14, the beam dose D can be defined by a function D (CD) in which the pattern line width (CD) is set to be a variable. It is shown herein that the beam dose D is in proportion to the pattern line width (CD), as an example. This correlation information D(CD) 242 is stored in the magnetic disk unit 246.

The electron beam writing method according to the present Embodiment will now be described referring to the explanation above mentioned as an assumption.

At Step 202, as a pattern data input step, the control computing unit 110 inputs the pattern data 150 to write a pattern in a writing region. The inputted pattern data 150 is stored in the memory 130 or the magnetic disk unit 246.

At Step 204, as a writing time estimation step, the writing data processing part 120 being an example of a time calculating part generates shot data based on the pattern data 150, and calculates a total writing time $t_w$ for writing the pattern data 150 based on the shot data. In other words, the total writing time $t_w$ required for writing a pattern is estimated. If the total writing time is already known, it is acceptable to input the known time.

At Step 206, as a loading effect correction coefficient acquisition step, a loading effect correction coefficient $\theta_L$ at an arbitrary time, after the writing start time and within the writing time, for writing the pattern data 150 is acquired by using a correlation among the time t having passed since the writing start time, the estimated total writing time $t_w$, and the loading effect correction coefficient $\theta_L$. First, the loading effect correction coefficient acquiring part 214 reads the correlation information 244 from the magnetic disk unit 246. Then, a loading effect correction coefficient $\theta_L$ (t=w) corresponding to a desired CD in the case of there being no elapsed time is calculated. Next, the coefficient parameter 245 is read from the magnetic disk unit 246. By using the loading effect correction coefficient $\theta_L$ (t=w) and the coefficient $\gamma$, the loading effect correction coefficient $\theta_L$ (t) at an arbitrary time after the writing start time is calculated based on the equation (9). As to the order of reading the correlation information 244 and the coefficient parameter 245, whichever of the two may come first. Alternatively, both of them can be read at the same time.

At Step 208, as a dimension variation amount calculation step, the dimension variation amount calculating part 215 calculates a dimension variation amount $\Delta l(x, y)$ at an arbitrary time after the writing start time by using the calculated loading effect correction coefficient $\theta_L(t)$. In this case, the equation (7) mentioned above may be used as a calculation method. In that case, instead of the loading effect correction coefficient $\theta_L$ which is substituted in the equation, the loading effect correction coefficient $\theta_L(t)$ at an arbitrary time after writing start can be used.

At Step 210, as a beam dose acquisition step, the beam dose acquiring part 216 acquires, or "obtains" the beam dose D at an arbitrary time, after the writing start time and within the writing time, based on the calculated dimension variation amount $\Delta l(x, y)$. The beam dose acquiring part 216 reads the correlation information D (CD) 242 from the magnetic disk unit 246. Then, the dimension variation amount $\Delta l(x, y)$ to be corrected is added to a desired CD. As a result, a value of CD" to be written after correcting can be obtained. Then, the beam dose D corresponding to the CD" is acquired from the correlation information D(CD) 242.

Steps after the beam irradiation time calculation step (S212) are the same as those after the beam irradiation time calculation step (S112) in Embodiment 1.

Figure 15:
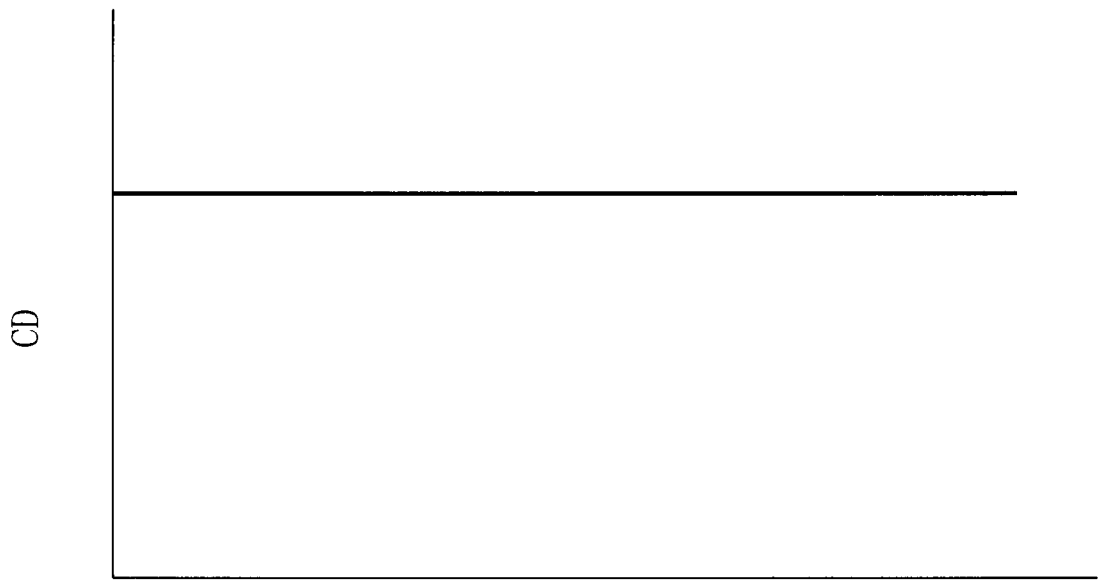
FIG. 15 is a graph showing an example of a correlation between a pattern line width (CD) after correcting and an elapsed time T according to Embodiment 2.

FIG. 15 is a graph showing an example of a correlation between a pattern line width (CD) after correcting and an elapsed time T described in Embodiment 2. By changing the loading effect correction coefficient $\theta_L(t)$ according to the time, as shown in FIG. 15, the uniformity of the line width dimension can be enhanced. Thus, it becomes possible to perform correcting the dimension variation due to the loading effect, by taking the elapsed time into consideration.

As mentioned above, the error between pattern categories can be reduced by changing the loading effect correction coefficient $\theta_L(t)$ depending upon a time. Moreover, it is possible to prevent throughput degradation due to a film thickness measurement, re-irradiation, and the like. Furthermore, according to Embodiment 2, even if there is no pattern for determining a corrected dose, such as the pattern described in JP-A-2000-267259, it is possible to calculate the dose for correcting as well as Embodiment 1. Furthermore, even if there is no film thickness measuring apparatus, exposure assist chamber and the like in addition to the main part of the exposure apparatus, the dose for correcting the line width (CD) variation at an arbitrary time after writing the mask can be calculated.

In the example mentioned above, the loading effect correction coefficient $\theta_L(t)$ is calculated by using the equation (9). However, it is not limited thereto. For example, it is also suitable to perform calculation by the method described below. First, instead of the coefficient parameter 245, the correlation information CD(T) between the elapsed time T and the CD as shown in FIG. 5 is stored in the magnetic disk unit 246. Then, the loading effect correction coefficient acquiring part 214 reads the correlation information CD(T) from the magnetic disk unit 246. With respect to a desired CD at an arbitrary time after the writing start time, the elapsed time T is calculated based on T=$t_w$-t. Then, CD', whose dimension has changed because of the elapsed time T, is calculated based on the correlation information CD(T). Next, the correlation information 244 is read from the magnetic disk unit 246. The loading effect correction coefficient $\theta_L$ corresponding to the CD' at the elapsed time T having passed is calculated. This calculated loading effect correction coefficient $\theta_L$ becomes the loading effect correction coefficient $\theta_L(t)$ at an arbitrary time after the writing start time. As to the order of reading the correlation information 244 and the correlation information CD(T), whichever of the two may come first. Alternatively, both of them can be read at the same time.

It is preferable to configure the correlation information CD(T) and the correlation information G(CD) 244 by an approximate expression or a table, etc. Moreover, it is also preferable to configure the correlation information D(CD) 242 by an approximate expression or a table, etc.

As mentioned above, according to Embodiment 2, it is possible to calculate the dose for correcting the line width (CD) variation due to the loading effect after writing the mask at an arbitrary time after the writing start time. Then, by performing writing using such a calculated dose, the line width (CD) variation due to the loading effect because of a time elapsed after the writing can be corrected.

Embodiment 3

In the above Embodiment 2, it is described that the dimension variation due to the loading effect can be corrected by performing correction of the beam dose D(x, y) at the time of writing a pattern by the EB pattern writing apparatus 100. According to Embodiment 3, it will be described that pattern data before inputting into the EB pattern writing apparatus 100 is corrected in advance.

Figure 16:
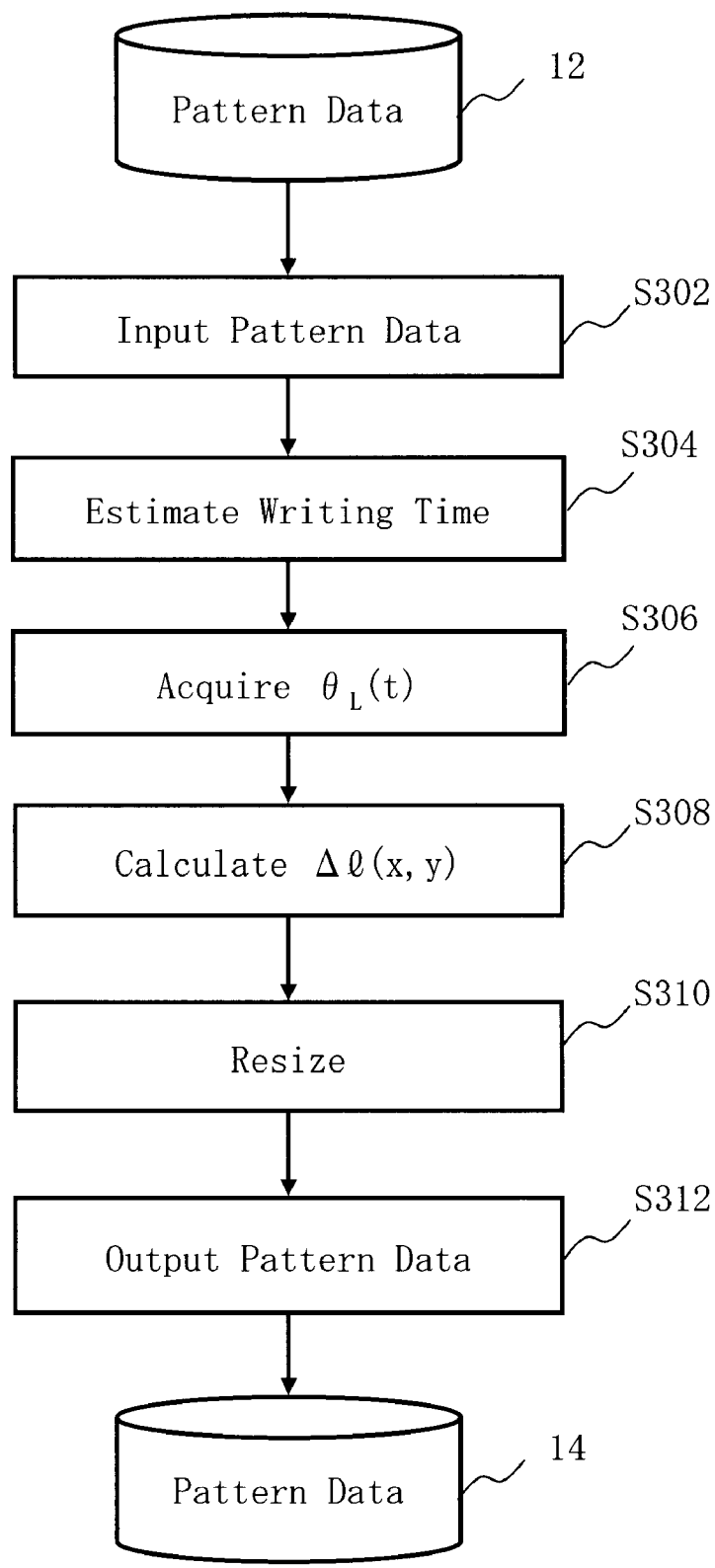
FIG. 16 is a flowchart showing main steps of a method of resizing an amount of dimension variation due to a loading effect according to Embodiment 3.

FIG. 16 is a flowchart showing main steps of a method of resizing the amount of dimension variation due to the loading effect described in Embodiment 3. In the figure, the resizing method executes a series of steps including a pattern data input step (S302), a writing time estimation step (S304), an acquisition step (S306) of a loading effect correction coefficient $\theta_L(t)$, a calculation step (S308) of a dimension variation amount $\Delta l(x, y)$ due to the loading effect, a resizing step (S310), and a pattern data output step (S312).

Figure 17:
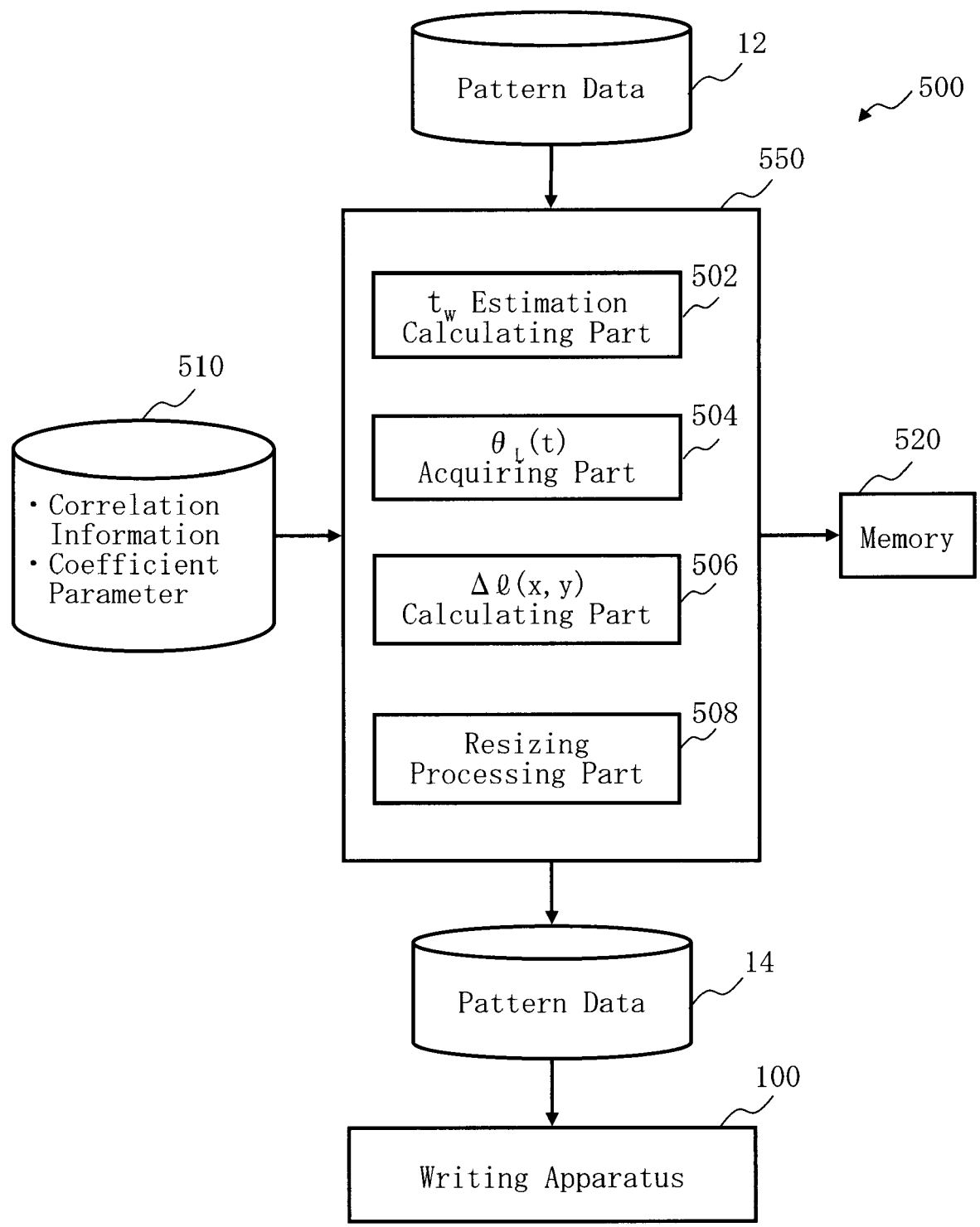
FIG. 17 is a schematic diagram showing an example of a main part of a data conversion apparatus according to Embodiment 3.

FIG. 17 is a schematic diagram showing an example of a main part of a data conversion apparatus according to Embodiment 3. In the figure, a data conversion apparatus 500 includes a control computing unit 550, a memory 520, and a magnetic disk unit 510. The data conversion apparatus 500 serves as an example of a resizing apparatus. The memory 520 and the magnetic disk unit 510 serve as examples of a storage device. The control computing unit 550 includes functions of a writing time estimation calculating part 502, a loading effect correction coefficient acquiring part 504, a dimension variation amount calculating part 506, and a resizing processing part 508. Moreover, the correlation information 242 between the CD and the dose D, the correlation information 244 between the loading effect correction coefficient $\theta_L$ and the CD, and the coefficient parameter 245, which have been explained in Embodiment 2, are stored in the magnetic disk unit 510. While only the structure elements necessary for explaining Embodiment 3 are shown in FIG. 17, it should be understood that other structure elements generally necessary for the data conversion apparatus 500 are also included. Moreover, although it is shown in FIG. 17 that the control computing unit 550 serving as an example of a computer executes each of the functions of the writing time estimation calculating part 502, the loading effect correction coefficient acquiring part 504, the dimension variation amount calculating part 506, and the resizing processing part 508, it should not be limited thereto. For example, they may be executed by hardware of an electric circuit. Alternatively, they may be executed by a combination of hardware and software, or a combination of hardware and firmware.

At Step 302, as a pattern data input step, the control computing unit 550 inputs the pattern data 12 to write a pattern in a writing region. The inputted pattern data 12 is stored in the memory 520 or the magnetic disk unit 510.

At Step 304, as a writing time estimation step, the writing time estimation calculating part 502 calculates the total writing time $t_w$ for writing the pattern data 12, based on the pattern data 12. In other words, the total writing time $t_w$ for writing a pattern is estimated. If the total writing time is already known, it is acceptable to input the known time.

At Step 306, as a loading effect correction coefficient acquisition step, a loading effect correction coefficient $\theta_L$ at an arbitrary time, after the writing start time and within the writing time, for writing the pattern data 12 is acquired by using a correlation among the time t having passed since the writing start time, the estimated total writing time $t_w$, and the loading effect correction coefficient $\theta_L$. First, the loading effect correction coefficient acquiring part 504 reads the correlation information 244 from the magnetic disk unit 510. Then, a loading effect correction coefficient $\theta_L$ (t=w) corresponding to a desired CD in the case of there being no elapsed time is calculated. Next, the coefficient parameter 245 is read from the magnetic disk unit 510. By using the loading effect correction coefficient $\theta_L$ (t=w) and the coefficient γ, the loading effect correction coefficient $\theta_L$ (t) at an arbitrary time after the writing start time is calculated based on the equation (9). As to the order of reading the correlation information 244 and the coefficient parameter 245, whichever of the two may come first. Alternatively, both of them can be read at the same time.

In this case, the loading effect correction coefficient $\theta_L(t)$ may be obtained from the correlation information CD(T) and the correlation information G(CD) 244 like Embodiment 2. In that case, first, instead of the coefficient parameter 245, the correlation information CD(T) between the elapsed time T and the CD as shown in FIG. 5 is stored in the magnetic disk unit 510. Then, the loading effect correction coefficient acquiring part 504 reads the correlation information CD (T) from the magnetic disk unit 510. With respect to a desired CD at an arbitrary time after the writing start time, the elapsed time T is calculated based on T=$t_w$−t. Then, CD', whose dimension has changed because of the elapsed time T is calculated based on the correlation information CD(T). Next, the correlation information 244 is read from the magnetic disk unit 510. The loading effect correction coefficient $\theta_L$ corresponding to the CD' at the elapsed time T having passed is calculated. This calculated loading effect correction coefficient $\theta_L$ becomes the loading effect correction coefficient $\theta_L(t)$ at an arbitrary time after the writing start time.

At Step 308, as a dimension variation amount calculation step, the dimension variation amount calculating part 506 calculates a dimension variation amount $\Delta l(x, y)$ at an arbitrary time after the writing start time by using the calculated loading effect correction coefficient $\theta_L(t)$. In this case, the equation (7) mentioned above may be used as a calculation method. In that case, instead of the loading effect correction coefficient $\theta_L$ which is substituted in the equation, the loading effect correction coefficient $\theta_L(t)$ at an arbitrary time after writing start can be used.

At Step 310, as a resizing step, the resizing processing part 508 resizes the pattern data 12 according to an estimated time to be passed since the writing start time, based on the calculated dimension variation amount $\Delta l(x,y)$ at an arbitrary time. Specifically, the dimension variation amount $\Delta l(x, y)$ is added to or subtracted from the original dimension of the original pattern data 12.

At Step 312, as an output step, the control computing unit 550 outputs pattern data 14, which has been resized, to be stored in the magnetic disk unit 510. Alternatively, it may output to the pattern writing apparatus 100.

Owing to the structure described above, it becomes possible to perform resizing using a resizing amount different depending upon an elapsed time after writing. This enables to previously correct the pattern data itself before inputting it into a pattern writing apparatus. Thus, it is also preferable to correct the pattern data itself in advance before inputting it into a pattern writing apparatus.

In the Embodiments mentioned above, $D_0(t)$, $\theta_F(t)$, and $\theta_L(t)$ are explained as primary functions of the time "t". However, they are not limited thereto. Other functions may also be suitably used according to the characteristics of the resist. For example, they can be defined as secondary functions of $D_0(t)=at^2+bt+c$, $\theta_F(t)=a't^2+b't+c'$, and $\theta_L(t)=a''t^2+b''t+c''$. Alternatively, they can be defined as exponent functions of $D_0=d+f\cdot\exp(-t/T)$, $\theta_F(t)=d'+f'\cdot\exp(-t/T')$, and $\theta_L(t)=d''+f''\cdot\exp(-t/T'')$. The coefficients a, b, c, a', b', c', d, f, T, d', f', T', etc. are constants to be varied depending upon the characteristics of the resist. These definitions may be optimized based on the results of experiments for previously inquiring time characteristics of the CDs described in the above Embodiments. The values and equations of such optimized coefficients (parameters) are stored, for example, in the hard disk unit of the pattern writing apparatus, as in the form of a program, etc. Then, when performing writing, $D_0(t)$, $\theta_F(t)$, and $\theta_L(t)$ may be calculated by substituting these parameter values into the equations.

In the Embodiments mentioned above, $D_0(t)$, $\theta_F(t)$, and $\theta_L(t)$ are calculated by the approximate expressions as relational expressions. However, the following method is also suitable. The optimum values of the $D_0(t)$, $\theta_F(t)$, and $\theta_L(t)$ at a certain time are obtained by experiments, without using the approximate expressions, and the experiment data is stored in the form of a table, etc. in a hard disk, for example. Then, when writing, the value may be obtained by referring to the table. Alternatively, the value may be calculated by an interpolation method as needed.

Figure 18:
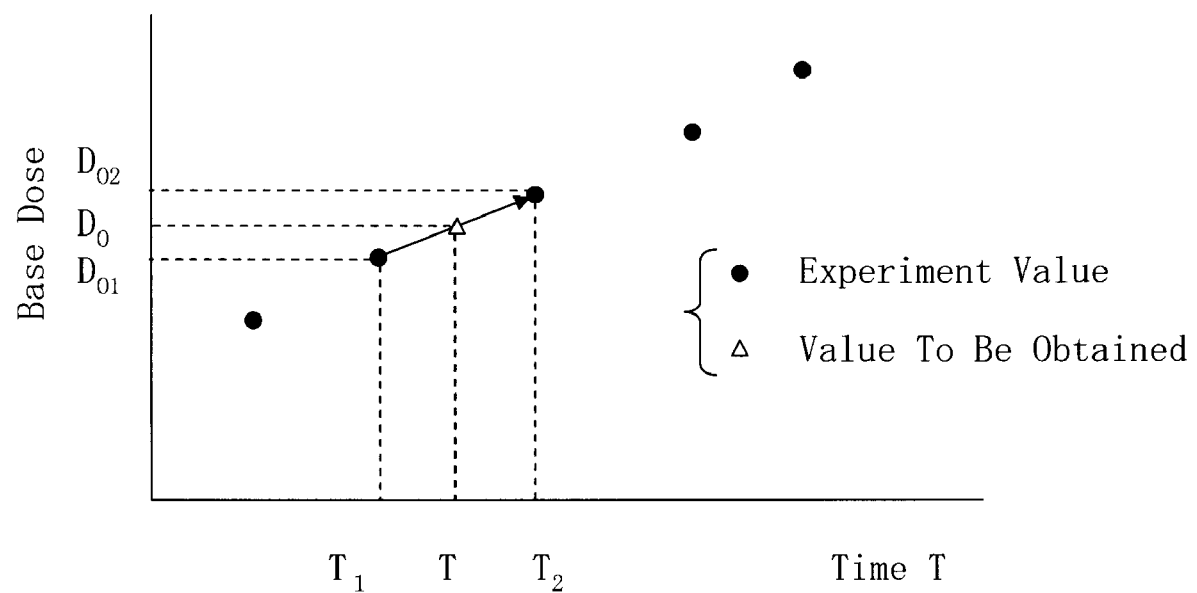
FIG. 18 shows the case of obtaining a value by an interpolation method.
Figure 19:
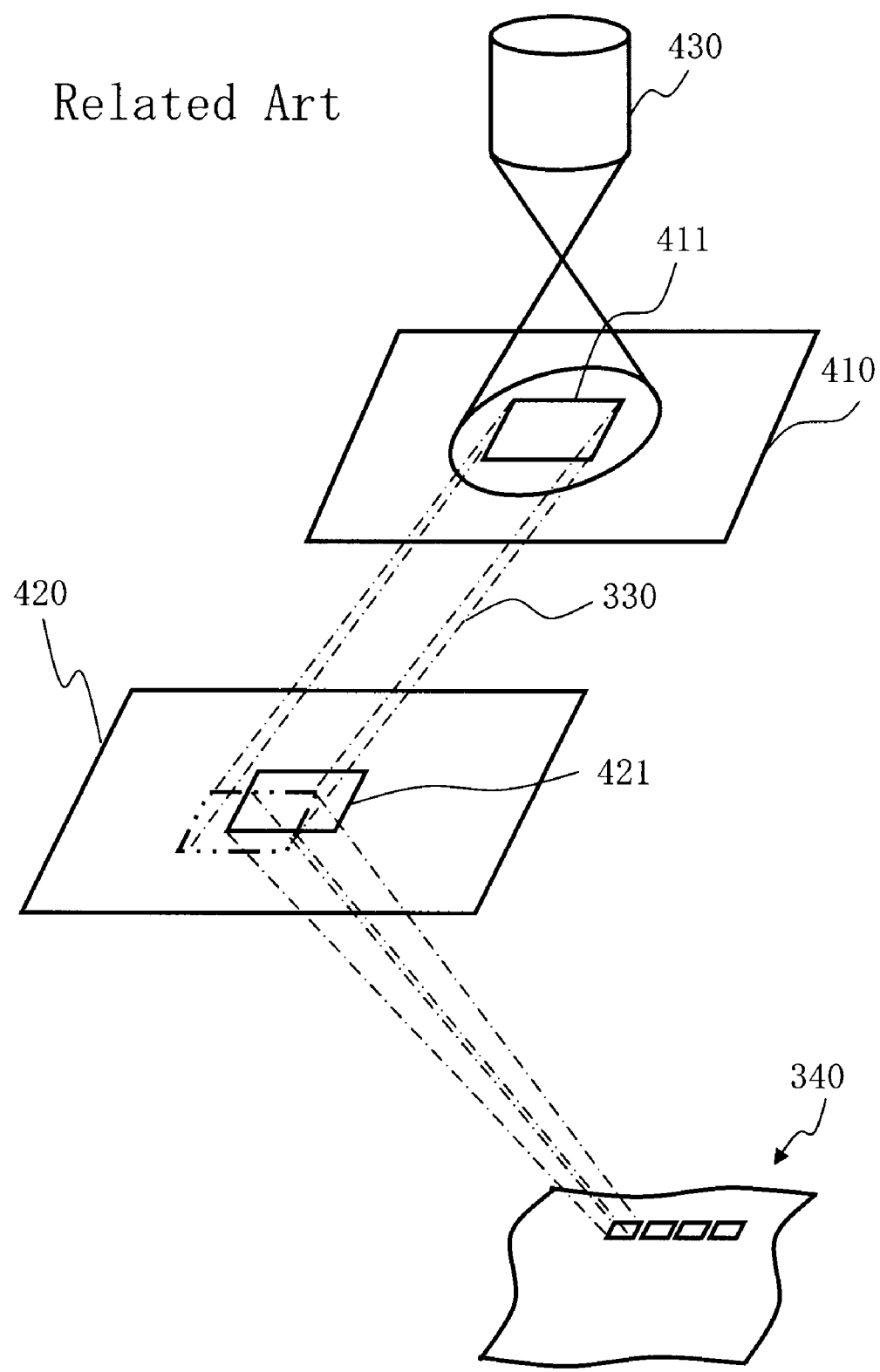
FIG. 19 shows a schematic diagram describing operations of a conventional variable-shaped electron beam pattern writing apparatus.

FIG. 18 shows the case of obtaining a value by the interpolation method. In the figure, $D_0(t)$ at the time t between the time $t_1$ and the time $t_2$ is obtained by interpolating, that is by using the time $t_1$ and $D_1$ being a $D_0(t_1)$ at the time $t_1$, and the time $t_2$ and $D_2$ being a $D_0(t_2)$ at the time $t_2$. More specifically, it can be obtained by $D_0(t)=(t-t_1)/(t_2-t_1)(D_2-D_1)+D_1$. Although it is described with respect to $D_0(t)$ in FIG. 18, $\theta_F(t)$ and $\theta_L(t)$ can also be calculated in the same manner.

In the above description, the processing contents or operation contents of what is represented by the word "part", "unit", or "step" in the above description can be configured by a computer-executable program. It may be executed by a software program, or alternatively by any combination of software, hardware and/or firmware. When configured by a program, the program is recordable or storable onto a recording medium, such as a magnetic disk drive, a magnetic tape drive, an FD, or a ROM (Read Only Memory). For example, the program is recorded on the magnetic disk drive 146, 246, or 510.

Moreover, in FIG. 2 or FIG. 10, the control computing unit 110 being a computer may be further connected, via a bus (not shown), to a RAM (Random Access Memory), a ROM, or a magnetic disk (HD) drive unit serving as an example of a storage device, a keyboard (K/B) or a mouse serving as an example of an input means, a monitor or a printer serving as an example of an output means, or an external interface (I/F), an FD, a DVD, or a CD serving as an example of an input/output means. Moreover, the same can be applied to the control computing unit 550 serving as a computer in FIG. 17.

As mentioned above, the embodiments have been described with reference to concrete examples. However, the present invention is not limited to these concrete examples. For example, the configuration of Embodiment 2 or Embodiment 3 can be applied to the case that the loading effect occurs due to a reason other than etching. For example, the configuration is applicable to the case of the loading effect generated during a chemical mechanical polishing (CMP) processing.

Moreover, although description of the apparatus structure, control methods, etc. not directly required for explaining the present invention is omitted, it is possible to suitably select and use some or all of them when needed. For example, while the structure of a control unit for controlling the EB pattern writing apparatus 100 is not described in detail, it should be understood that a necessary control unit structure can be appropriately selected and used.

In addition, any writing method using a charged particle beam, resizing method of a dimension variation amount due to a loading effect, program causing a computer to execute the methods, and apparatus embodying the methods that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
    a writing time estimation calculating part configured, based on pattern data to be written in a writing region, to estimate a total writing time for writing a pattern based on the pattern data with a charged particle beam;
    a base dose acquiring part configured to acquire a base dose at an arbitrary time, after writing start time and within the total writing time, in writing using the pattern data, by using a first correlation among a time having passed since the writing start time, the total writing time, and the base dose;
    a fogging effect correction coefficient acquiring part configured to acquire a fogging effect correction coefficient at the arbitrary time, in writing using the pattern data, by using a second correlation among the time having passed since the writing start time, the estimated total writing time and the fogging effect correction coefficient;
    a beam dose calculating part configured to calculate a beam dose at the arbitrary time by using the base dose and the fogging effect correction coefficient;
    a beam irradiation time calculating part configured to calculate a beam irradiation time of the charged particle beam at a position in the writing region, based on a calculated beam dose;
    a deflector configured to deflect the charged particle beam according to the beam irradiation time; and
    an aperture configured to block the charged particle beam deflected by the deflector.

2. The writing apparatus according to claim 1, wherein the first correlation is obtained based on a first coefficient parameter and a relation between a pattern line width and the base dose, wherein the first coefficient parameter is obtained based on a relation between an elapsed time after writing and the base dose for correcting the pattern line width which varies depending upon the elapsed time.

3. The writing apparatus according to claim 1, wherein the second correlation is obtained based on a second coefficient parameter and a relation between a pattern line width and the fogging effect correction coefficient, wherein the second coefficient parameter is obtained based on a relation between an elapsed time after writing and the fogging effect correction coefficient for correcting the pattern line width which varies depending upon the elapsed time.

4. A charged particle beam writing apparatus comprising:
- a writing time estimation calculating part configured, based on pattern data to be written in a writing region, to estimate a total writing time for writing the pattern data with a charged particle beam;
- a loading effect correction coefficient acquiring part configured to acquire a loading effect correction coefficient at an arbitrary time, after writing start time and within the total writing time, in writing using the pattern data, by using a correlation among a time having passed since the writing start time, the total writing time, and the loading effect correction coefficient;
- a dimension variation amount calculating part configured to calculate a dimension variation amount due to a loading effect at the arbitrary time by using the loading effect correction coefficient;
- a beam dose acquiring part configured to acquire a beam dose at the arbitrary time based on the dimension variation amount;
- a beam irradiation time calculating part configured to calculate a beam irradiation time of the charged particle beam at a position in the writing region, based on a acquired beam dose;
- a deflector configured to deflect the charged particle beam according to the beam irradiation time; and
- an aperture configured to block the charged particle beam deflected by the deflector.

5. A charged particle beam writing method comprising:
- inputting pattern data to be written in a writing region;
- estimating a total writing time for writing a pattern based on the pattern data;
- acquiring a base dose at an arbitrary time, after writing start time and within the total writing time, in writing using the pattern data, by using a first correlation among a time having passed since the writing start time, the total writing time, and the base dose;
- acquiring a fogging effect correction coefficient at the arbitrary time, in writing using the pattern data, by using a second correlation among the time having passed since the writing start time, the total writing time and the fogging effect correction coefficient;
- calculating a beam dose at the arbitrary time by using the base dose and the fogging effect correction coefficient; and
- writing a position in the writing region with the charged particle beam, according to the beam dose.

6. The writing method according to claim 5, wherein the first correlation is obtained based on a first coefficient parameter and a relation between a pattern line width and the base dose, wherein the first coefficient parameter is obtained based on a relation between an elapsed time after writing and the base dose for correcting the pattern line width which varies depending upon the elapsed time.

7. The writing method according to claim 5, wherein the second correlation is obtained based on a second coefficient parameter and a relation between a pattern line width and the fogging effect correction coefficient, wherein the second coefficient parameter is obtained based on a relation between an elapsed time after writing and the fogging effect correction coefficient for correcting the pattern line width which varies depending upon the elapsed time.

8. A charged particle beam writing method comprising:
- estimating a total writing time for writing a pattern to be written in a writing region, based on a pattern data;
- acquiring a loading effect correction coefficient at an arbitrary time, after writing start time and within the total writing time, in writing using the pattern data, by using a correlation among a time having passed since the writing start time, the total writing time, and the loading effect correction coefficient;
- calculating a dimension variation amount due to the loading effect at the arbitrary time by using the loading effect correction coefficient;
- obtaining a beam dose at the arbitrary time based on the dimension variation amount; and
- writing a position in the writing region with the charged particle beam, according to the beam dose.

9. A method for resizing a dimension variation amount comprising:
- estimating a total writing time for writing a pattern to be written in a writing region, based on a pattern data;
- acquiring a loading effect correction coefficient at an arbitrary time, after writing start time and within the total writing time, in writing using the pattern data, by using a correlation among a time having passed since the writing start time, the total writing time, and the loading effect correction coefficient;
- calculating a dimension variation amount due to the loading effect at the arbitrary time by using the loading effect correction coefficient; and
- resizing the pattern data according to an estimated time to be passed since the writing start time, based on the dimension variation amount and outputting resized pattern data.

* * * * *